United States Patent
Baek et al.

(10) Patent No.: US 11,626,516 B2
(45) Date of Patent: Apr. 11, 2023

(54) INTEGRATED CIRCUITRY INCLUDING VERTICAL CHANNEL STRUCTURE AND LAYOUT METHOD OF THE SAME

(71) Applicant: SAMSUNG ELECTRONICS CO., LTD., Suwon-si (KR)

(72) Inventors: Sanghoon Baek, Seoul (KR); Jeong Soon Kong, Daejeon (KR); Jung Ho Do, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 53 days.

(21) Appl. No.: 17/138,027

(22) Filed: Dec. 30, 2020

(65) Prior Publication Data

US 2021/0328056 A1 Oct. 21, 2021

(30) Foreign Application Priority Data

Apr. 20, 2020 (KR) .................. 10-2020-0047494

(51) Int. Cl.
| | |
|---|---|
| *H01L 29/78* | (2006.01) |
| *H01L 27/088* | (2006.01) |
| *H01L 29/66* | (2006.01) |
| *H01L 29/417* | (2006.01) |

(52) U.S. Cl.
CPC ........ *H01L 29/7827* (2013.01); *H01L 27/088* (2013.01); *H01L 29/41791* (2013.01); *H01L 29/66666* (2013.01); *H01L 29/66795* (2013.01); *H01L 29/785* (2013.01)

(58) Field of Classification Search
CPC ............... H01L 29/7827; H01L 27/088; H01L 29/41791; H01L 29/66666; H01L 29/66795; H01L 29/785; H01L 27/11807; H01L 27/0207; H01L 21/823871; H01L 21/823885; H01L 29/78642; H01L 2027/11875; H01L 27/092; H01L 29/0653; H01L 29/0603; H01L 29/0684; H01L 29/1025; H01L 29/1029
See application file for complete search history.

(56) References Cited

U.S. PATENT DOCUMENTS

| | | | |
|---|---|---|---|
| 6,734,740 B1 | 5/2004 | Green et al. | |
| 8,212,311 B2 * | 7/2012 | Masuoka | H01L 21/823878 257/E27.059 |
| 9,548,385 B1 | 1/2017 | Cheng et al. | |
| 10,083,869 B2 | 9/2018 | Guo et al. | |
| 10,096,706 B2 | 10/2018 | Wang et al. | |
| 10,146,900 B2 | 12/2018 | Sahu et al. | |
| 10,204,834 B2 | 2/2019 | Heo | |
| 10,276,564 B2 | 4/2019 | Cantoro et al. | |
| 10,297,687 B2 | 5/2019 | Heo et al. | |

(Continued)

*Primary Examiner* — Cuong B Nguyen
(74) *Attorney, Agent, or Firm* — Sughrue Mion, PLLC

(57) ABSTRACT

Provided is an integrated circuit implemented by a plurality of vertical field effect transistors (VFETs) in one or more semiconductor cells, wherein a distance between a pair of second vertical channel structures of a first cell and an adjacent pair of first vertical channel structures in a second cell, all facing a cell boundary between the first and second cells, is the same as a distance between the pair of the first vertical channel structures and a pair of second vertical channel structures arranged next to the pair of the first vertical channel structures in the first cell.

22 Claims, 30 Drawing Sheets

(56) References Cited

U.S. PATENT DOCUMENTS

| | | |
|---|---|---|
| 10,332,801 B2 | 6/2019 | Anderson et al. |
| 10,361,319 B2 | 7/2019 | Cantoro et al. |
| 2018/0248035 A1 | 8/2018 | Park et al. |
| 2019/0081174 A1 | 3/2019 | You et al. |
| 2019/0081180 A1 | 3/2019 | Park et al. |
| 2019/0157452 A1 | 5/2019 | Kim et al. |
| 2019/0326165 A1 | 10/2019 | Xie et al. |

* cited by examiner

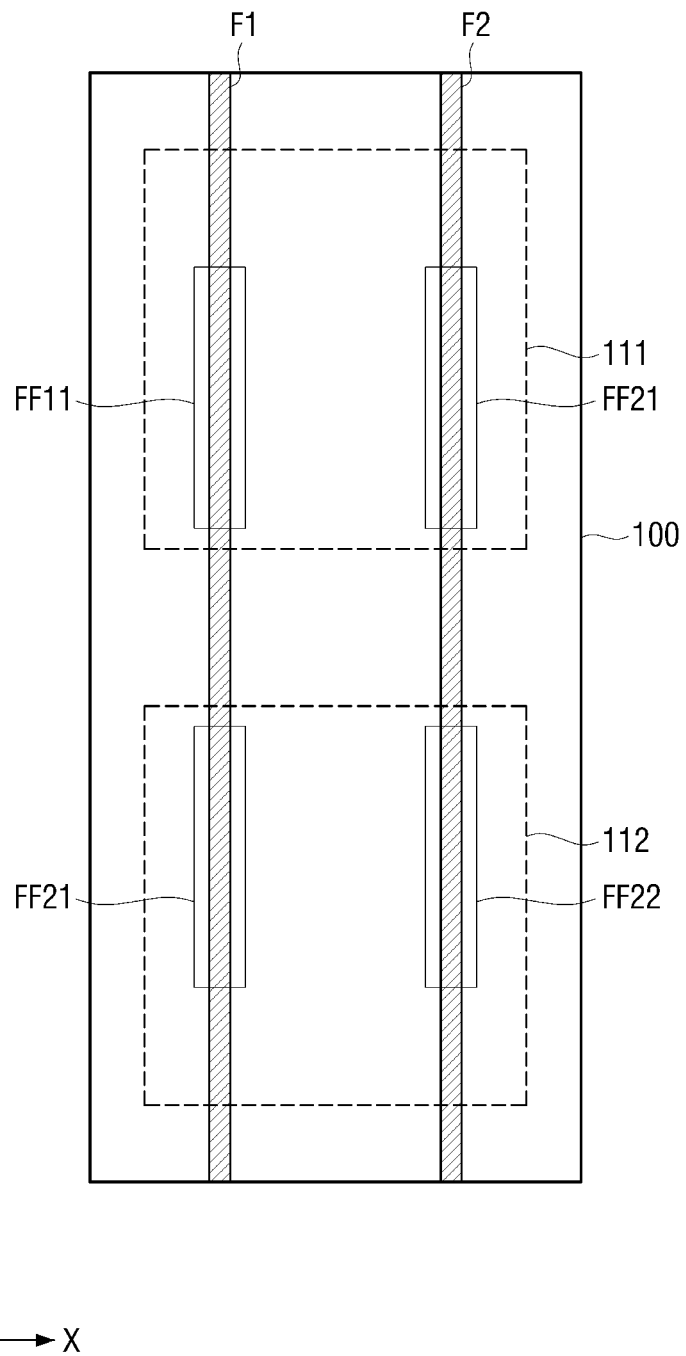

INTEGRATED CIRCUITRY INCLUDING VERTICAL CHANNEL STRUCTURE AND LAYOUT METHOD OF THE SAME

CROSS-REFERENCE TO THE RELATED APPLICATION

This application is based on and claims priority from Korean Patent Application No. 10-2020-0047494, filed on Apr. 20, 2020 in the Korean Intellectual Property Office, the disclosure of which is incorporated herein in its entirety by reference

BACKGROUND

1. Field

The inventive concept relates to an integrated circuit, and more particularly, to an integrated circuit implemented in a semiconductor cell including a transistor having a vertical channel structure.

2. Description of the Related Art

An integrated circuit may be designed on the basis of one or more cells. Specifically, a layout of the integrated circuit may be generated by placing one or more of cells depending on information defining the integrated circuit and by routing the cells. Such cells may be predesigned and stored in a cell library, and may be referred to as standard cells.

In the recent semiconductor fabricating process, reducing the size of patterns included in the cells and the size of the cells are required.

SUMMARY

Embodiments of the inventive concept provide semiconductor cells including a plurality of transistors having a vertical channel structure.

The embodiments also provide methods of forming the semiconductor cells.

It is noted that the inventive concept is not restricted to the embodiments set forth herein. The inventive concept will become more apparent to one of ordinary skill in the art to which the inventive concept pertains by referencing the detailed description of the embodiments presented below.

According to an embodiment, there is provide an integrated circuit including first and second cells adjacent to each other in a first direction, The first cell may include: first and second lower source/drain regions extending on a substrate in the first direction, and arranged to be spaced apart from each other in a second direction; a pair of first vertical channel structures placed to intersect the first and second lower source/drain regions in the second direction; a pair of second vertical channel structures placed to intersect the first and second lower source/drain regions in the second direction, and arranged to be spaced apart from the pair of the first vertical channel structures in the second direction; a pair of first upper source/drain regions and a pair of second upper source/drain regions placed on the pair of first vertical channel structures and the pair of second vertical channel structures, respectively; first to fourth gate electrodes surrounding side surfaces of the pair of the first vertical channel structures and the pair of the second vertical channel structures, respectively; a connection metal layer connected to the first to fourth gate electrodes; an input wiring connected to at least one of the first to fourth gate electrodes through a gate via to receive an input signal; and an output wiring connected to the pair of the second upper source/drain regions through an upper source/drain via, wherein a distance between the pair of the second vertical channel structures of the first cell and an adjacent pair of first vertical channel structures in the second cell, all facing a cell boundary between the first and second cells, is the same as a distance between the pair of the first vertical channel structures and the pair of the second vertical channel structures, in the first direction.

According to an embodiment, there is provided an integrated circuit including first and second cells adjacent to each other in a first direction. Each of the first and second cells may include: first and second fin regions placed to be spaced apart from each other in a first direction and extending in a second direction; first and second vertical channel structures arranged to be spaced apart from each other in the second direction on the first fin region; third and fourth vertical channel structures arranged to be spaced apart from each other in the second direction on the second fin region; first to fourth upper source/drain regions placed on the first to fourth vertical channel structures, respectively; a first lower source/drain region extending in the first direction and placed below the first and third vertical channel structures; a second lower source/drain region extending in the first direction and placed below the second and fourth vertical channel structures; first to fourth gate electrodes surrounding side surfaces of the first to fourth vertical channel structures between the first to fourth upper source/drain regions and the first and second lower source/drain regions; a spacer layer formed between the first to fourth vertical channel structures and the first and second lower source/drain regions; and a connection metal layer placed between the first to fourth vertical channel structures and connected to at least one of the first to fourth gate electrodes, wherein a distance by which the connection metal layer and the first and second lower source/drain regions in the first cell are spaced apart from a cell boundary between the first and second cells is equal to a distance by which the connection metal layer and the first and second lower source/drain regions in the second cell are spaced apart from the cell boundary, and wherein a distance between the second fin region in the first cell and the first fin region in the second cell, both facing the cell boundary, is equal to a distance between the first and second fin regions in the first or second cell, in the first direction.

According to an embodiment, there is provided a layout method of an integrated circuit in a first cell adjacent to a second cell in a first direction. The method may include: forming first and second lower source/drain regions extending in a first direction and spaced apart from each other in a second direction, on a substrate; patterning first and second fin regions extending in the second direction and intersecting the first and second lower source/drain regions; forming first and second vertical channel structures on the first fin regions to correspond to the first and second lower source/drain regions, and forming third and fourth vertical channel structures on the second fin region to correspond to the first and second lower source/drain regions; forming first to fourth gate electrodes surrounding side surfaces of the first to fourth vertical channel structures, respectively; forming a connection metal layer connecting the first to fourth gate electrodes; forming first to fourth upper source/drain regions on the first to fourth vertical channel structures, respectively; forming at least one first upper source/drain contact and at least one second upper source/drain contact on at least two of the first to fourth upper source/drain regions; forming at least one gate contact on the connection metal layer; forming first and second source/drain vias on the first and second upper source/drain contacts, respectively, and forming a gate via on the gate contact; forming an input wiring extending in the second direction and connected to the gate via; and forming an output wiring extending in the second direction and connected to at least one of the first and second source/drain vias, wherein a distance between the second fin region in the first cell and an adjacent fin region in the second cell, both facing a cell boundary between the first and second cells, is the same as a distance between the first and second fin regions, in the first direction.

BRIEF DESCRIPTION OF THE DRAWINGS

The above and other embodiments and features of the present disclosure will become more apparent by describing in detail embodiments thereof with reference to the attached drawings, in which:

FIGS. 5A to 5I illustrate a process of forming a standard cell for an inverter in a plan view, according to an embodiment.

DETAILED DESCRIPTION OF THE EMBODIMENTS

Figure 1:
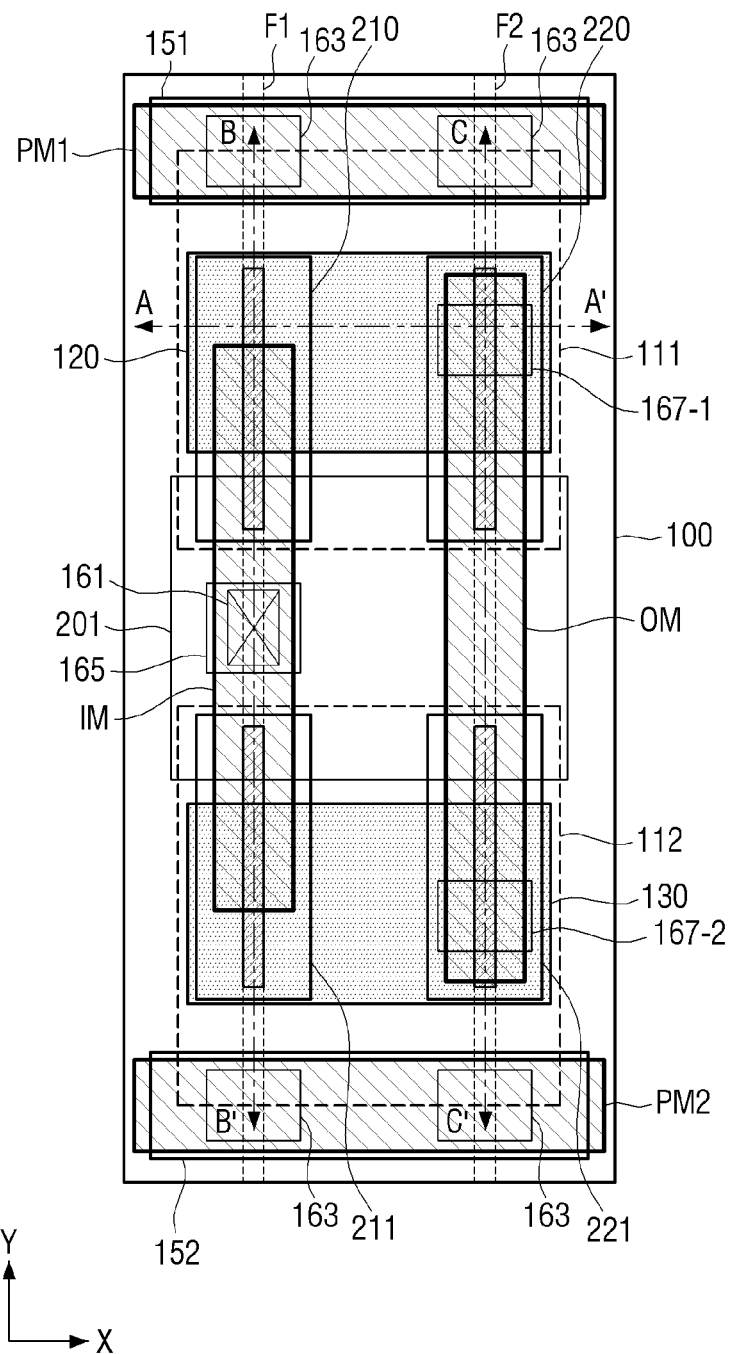
FIG. 1 is a plan view of a layout of a standard cell for an integrated circuit, which is an inverter, according to an embodiment.

Hereinafter, various embodiments according to the inventive concept will be described with reference to the attached drawings. The embodiments described herein are all example embodiments, and thus, the inventive concept is not limited thereto and may be realized in various other forms.

It will be understood that when an element or layer is referred to as being "over," "above," "on," "below," "under," "connected to" or "coupled to" another element or layer, it can be directly over, above, on, below, under, connected or coupled to the other element or layer or intervening elements or layers may be present. In contrast, when an element is referred to as being "directly over," "directly above," "directly on," "directly below," "directly under," "directly connected to" or "directly coupled to" another element or layer, there are no intervening elements or layers present. Like numerals refer to like elements throughout.

In the following description, integrated circuits of various embodiments formed on a substrate, such as a semiconductor substrate, are provided. The integrated circuits have a layout that includes one or more cells. These cells may be predesigned for repeated use in an individual integrated circuit design. Effective integrated circuit design layouts may include various types of predesigned cells and predefined rules related to arrangement of the cells to enhance performance of the integrated circuit and reduce an area of the integrated circuit. These cells may be referred to as standard cells.

An integrated circuit according to some embodiments may include one or more standard cells placed in an integrated circuit layout by predefined rules. Such standard cells are used repeatedly in the integrated circuit design. Therefore, the standard cells are designed in advance in accordance with fabricating technology and stored in the standard cell library. An integrated circuit designer may search for such standard cells, include them in the integrated circuit design, and may place them in the integrated circuit layout in accordance with a predefined arrangement rule.

The standard cells may include various basic circuits that are frequently used in a digital circuit design for electronic devices, such as a central processing unit (CPU), a graphic processing unit (GPU) and a system-on-chip (SOC), not being limited thereto. The basis circuits included in the standard cells may include circuits for inverter, AND, NAND, OR, XOR and NOR, not being limited thereto. The standard cells may also include other frequently used circuit blocks such as a flip-flop and a latch.

FIGS. 1 to 4 illustrate a cell for an inverter circuit formed of a plurality of vertical field effect transistors (VFETs) having vertical channel structures. Although each vertical channel is shown to include two vertical channel structures according to the present embodiment in FIGS. 1 to 4, the inventive concept is not limited thereto. That is, vertical channels of a VFET according to embodiments may include three or more vertical channel structures.

Figure 2:
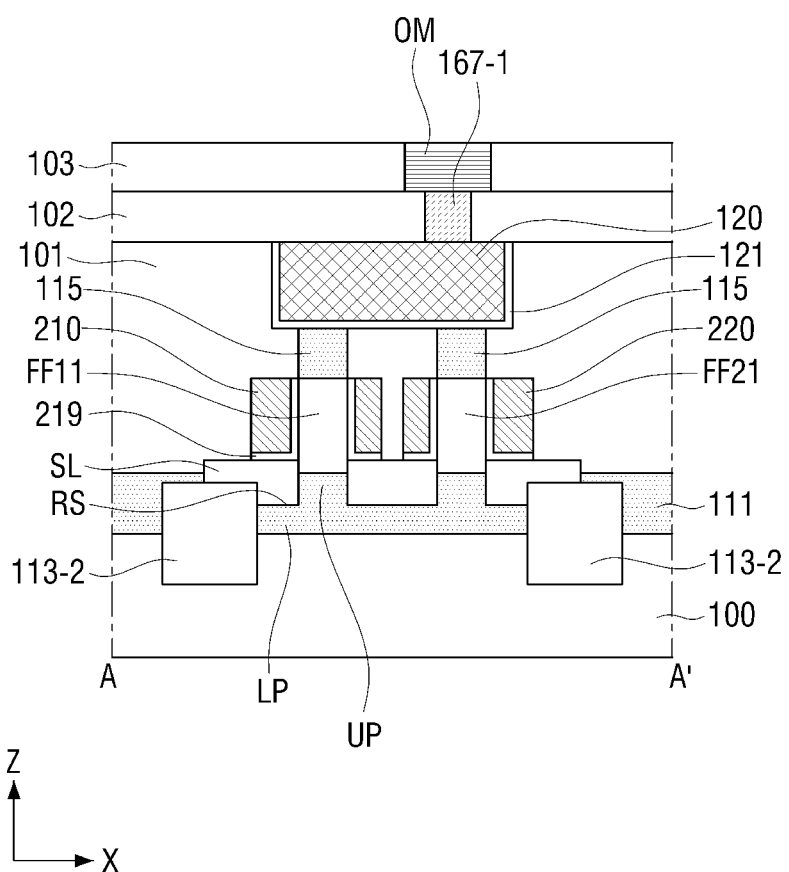
FIG. 2 is a cross-sectional view taken along a line A-A shown in FIG. 1, according to an embodiment.
Figure 3:
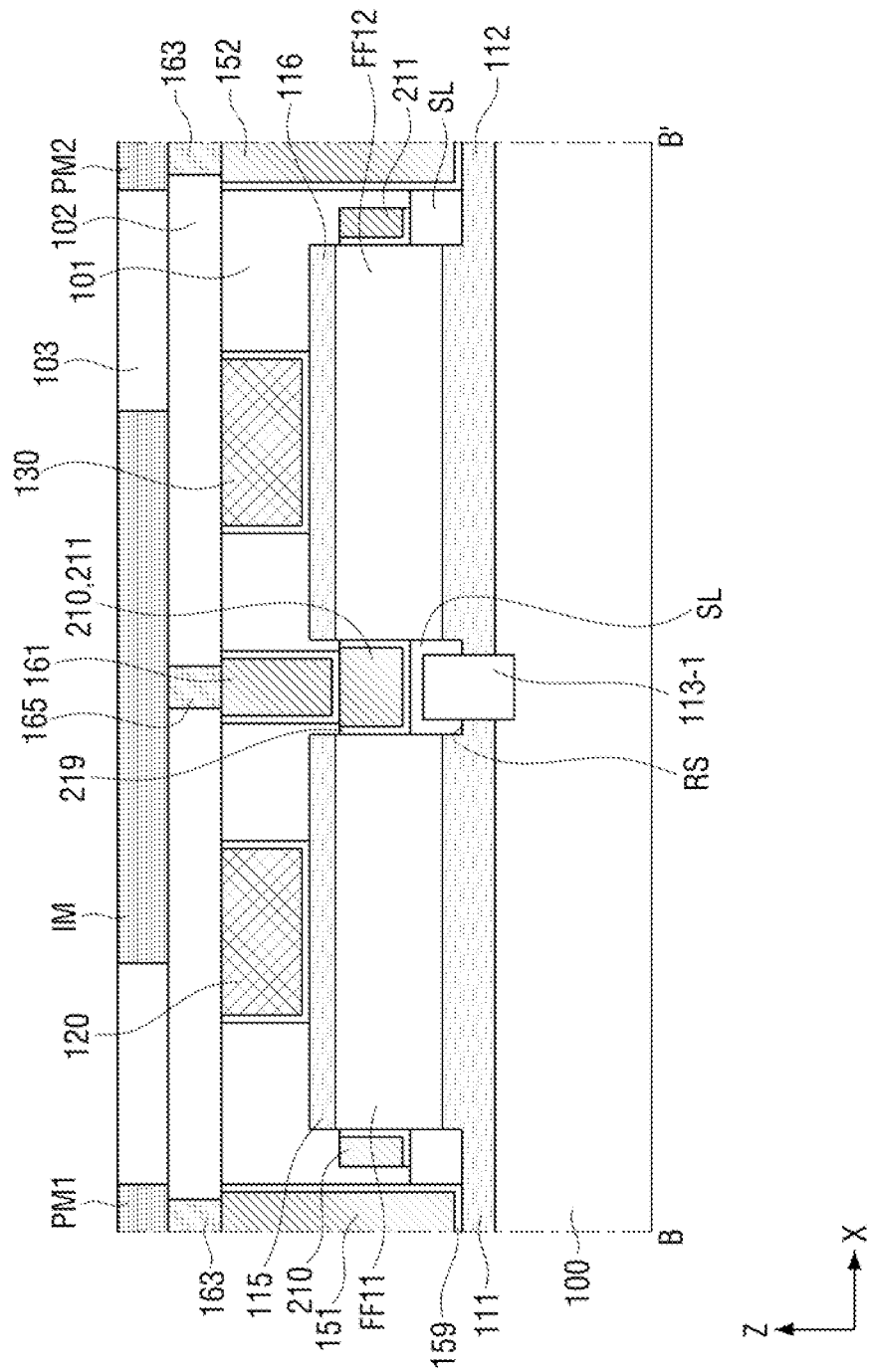
FIG. 3 is a cross-sectional view taken along a line B-B shown in FIG. 1, according to an embodiment.
Figure 4:
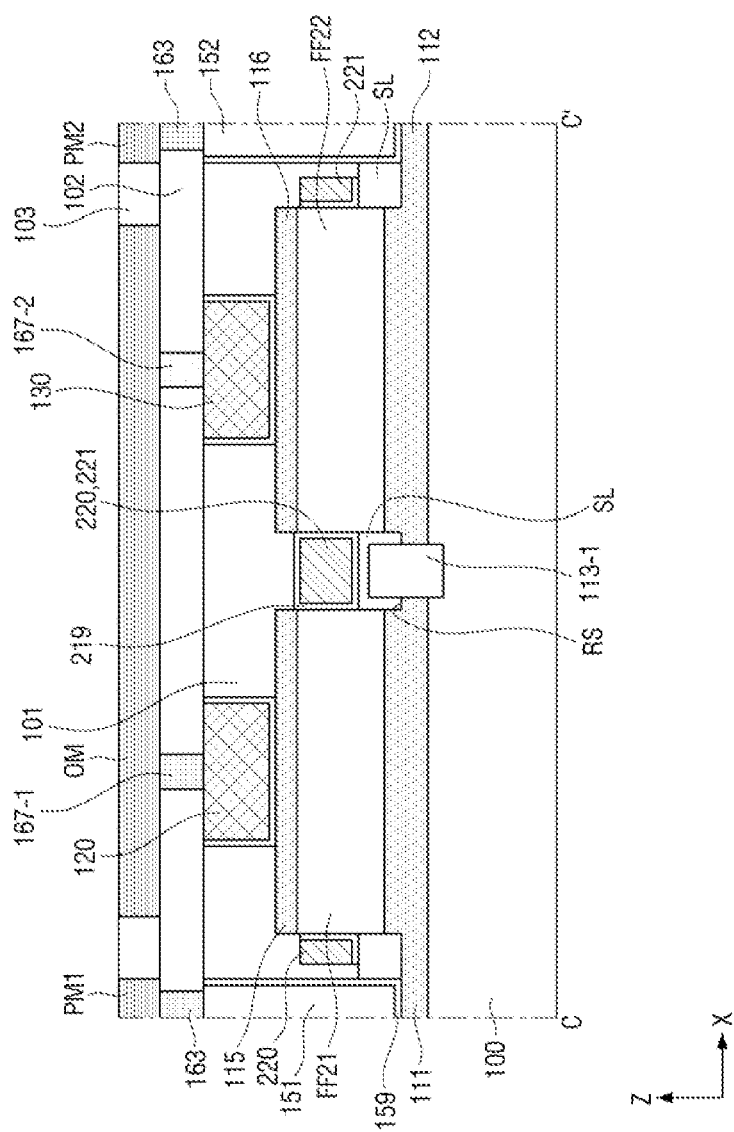
FIG. 4 is a cross-sectional view taken along a line C-C shown in FIG. 1, according to an embodiment

FIG. 1 is a plan view of a layout of a cell for an integrated circuit, which is an inverter, according to an embodiment. In FIG. 1, the cell is shown from a front-end-of-line (FEOL) to a back-end-of-line (BEOL). FIG. 2 is a cross-sectional view taken along a line A-A shown in FIG. 1. FIG. 3 is a cross-sectional view taken along a line B-B shown in FIG. 1. FIG. 4 is a cross-sectional view taken along a line C-C shown in FIG. 1. Referring to FIGS. 1 to 4, the integrated circuit may be formed by at least one cell which may include at least one VFET.

The cell for the inverter may include an n-type metal-oxide-semiconductor VFET (hereafter "NMOS") and a p-type metal-oxide-semiconductor field effect transistor (hereafter "PMOS"). Gates of the PMOS and the NMOS are commonly connected to an input node Vin, and one of source/drain regions of the PMOS is connected to a supply voltage Vdd. The other of the source/drain regions of the PMOS and a source/drain region of the NMOS are commonly connected to an output node Vout. The other the source/drain region of the NMOS is connected to a ground. The above NMOS and PMOS of the inverter in the cell according to the present embodiment may be implemented as a VFET, as described below.

The integrated circuit may include a plurality of fin regions F1 and F2 on the substrate 100. The substrate 100 may be a semiconductor substrate including silicon, germanium, silicon-germanium or the like, or may be a compound semiconductor substrate. The fin region F1 and F2 may have a pillar shape vertically protrude from the substrate 100. The fin regions F1 and F2 may also have a bar shape extending in a Y direction. From the fin regions F1 and F2, vertical channel structures FF11, FF12, FF21 and FF22 are formed as vertical channels for respective VFETs. A lower active region 111 may be formed below the vertical channel structures F11 and F21, and a lower active region 112 may be formed below the vertical channel structures F12 and F22. Further, an upper active region 115 may be formed above the vertical channel structures F11 and F21, and an upper active region 116 may be formed above the vertical channel structures F12 and F22. The fin regions F1 and F2 are spaced apart from each other at equal distances in the X direction, and may be parallel to each other in a bar shape which extend in the Y direction.

According to the present embodiment, the lower active regions 111 and 112 may be partial regions of the substrate 100. Specifically, according to the present embodiment, the lower active region 111 may be a source/drain region below the vertical channel structures F11 and F21, which is a region doped with P-type impurities. (e.g., boron) on the substrate 100. The lower active region 112 may be a source/drain region below the vertical channel structures F12 and F22, which is a region formed by being doped with N-type impurities (e.g., arsenic or phosphorus) on the substrate 100. Alternatively, according to an embodiment, the lower active regions 111 and 112 may be doped with N-type and P-type impurities, respectively.

The lower active regions 111 and 112 may be spaced apart from each other in the Y direction, while extending in the X direction. An active region separation film may be disposed between the lower active regions 111 and 112. The lower active regions 111 and 112 may be isolated by, for example, shallow trench isolation (STI) of the substrate 100.

The lower active regions 111 and 112 may be divided into an upper part UP and a lower part LP. The lower active regions 111 and 112 have an area of the lower part LP on a plane, but may have an upper part UP region partially protruding in the Z direction. The upper part UP of the lower active regions 111 and 112 has a shorter width in the X and Y directions than the lower part LP of the lower active regions 111 and 112, and the upper part UP of the lower active regions 111 and 112 has a bar shape extending in the Y direction corresponding to the fin regions F1 and F2.

The vertical channel structures FF11, FF12, FF21 and FF22 may be placed on the lower active region 111 and 112. The vertical channel structures FF11, FF12, FF21 and FF22 may have substantially the same planar shape as the upper part of the lower active region 111 and 112. The vertical channel structures FF11, FF12, FF21 and FF22 may be a semiconductor pillar which is grown, using the upper part UP of the lower active region 111 and 112 as a seed layer. The semiconductor material of the vertical channel structures FF11, FF12, FF21 and FF22 may be the same as the semiconductor material of the substrate 100, such as undoped silicon, or may be different from that.

Spacer layers SL may be formed on the lower active regions 111 and 112. The spacer layers SL may be disposed on sidewalls of the upper part UP of the lower active regions 111 and 112. A level of an upper surface of each of the spacer layers SL may be the same as or higher than a level of an upper surface of the upper part UP of the lower active region 111 and 112. The level of the upper surface of each of the spacer layers SL may be the same as or higher than a level of bottom surfaces of the vertical channel structures FF11, FF12, FF21 and FF22. The spacer layers SL may be an insulator, and may include, for example, a silicon oxide film, a silicon nitride film or a silicon oxynitride film.

Gate electrodes 210, 211, 220 and 221 may be provided on the spacer layer SL. The gate electrodes 210, 211, 220 and 221 may surround channel regions formed by the vertical channel structures FF11, FF12, FF21 and FF22, respectively. The gate electrodes 210, 211, 220 and 221 may be spaced apart from the lower active regions 111 and 112 by the spacer layers SL.

The upper active regions 115 and 116 may vertically protrude upward from a level of upper surfaces of the gate electrodes 210, 211, 220 and 221. The level of the upper surfaces of the gate electrodes 210, 211, 220 and 221 may be the same as or lower than a level of bottom surfaces of the upper active regions 115 and 116. As an example, the gate electrodes 210, 211, 220 and 221 may include at least one of a conductive metal nitride (e.g., titanium nitride or tantalum nitride) and a metal material (e.g., titanium, tantalum, tungsten, copper or aluminum).

A gate insulation film 219 may be disposed between the gate electrodes 210, 211, 220 and 221 and the vertical channel structures FF11, FF12, FF21 and FF22. The gate insulation film 219 may include a gate dielectric pattern (not shown) that is extended from sidewalls of the vertical channel structures FF11, FF12, FF21 and FF22 to the upper surfaces of the spacer layers SL. Thus, the gate insulation film 219 may also be disposed on bottom surfaces of the gate electrodes 210, 211, 220 and 221 and inner sidewalls of the gate electrodes 210, 211, 220 and 221. At least one surface of the gate insulation film 219 may contact the bottom surfaces and at least one side surface of the gate electrodes 210, 211, 220 and 221. The gate insulation film 219 may include a silicon oxide film, a silicon oxynitride film and/or a high-dielectric constant material. As an example, the high-dielectric constant material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate contact 161 may be formed on a gate connection structure (not shown) in the Y direction between the vertical channel structures FF11 and F12. The gate contact 161 is connected to the gate electrodes 210 and 211 through the gate connection structure, and may be formed to be spaced apart from the vertical channel structures FF11, FF12, FF21 and FF22 as shown in FIG. 1.

A fin region of an integrated circuit may form a vertical transistor, i.e., VFET, in which carriers move in a vertical direction (Z direction). When a voltage is applied to the gate electrodes 210, 211, 220 and 221 to turn on the vertical transistor, the carriers may move from the lower active regions 111 and 112 to the upper active regions 115 and 116 through the vertical channel structures FF11, FF12, FF21 and FF22. That is, the vertical channel structures FF11, FF12, FF21 and FF22 may function as channels of the NMOS and the PMOS.

The gate contact 161 may be connected to an input wiring IM through a gate via 165. The input wiring IM extends in the Y direction, but is formed to be spaced apart from power wirings PM1 and PM2 in the Y direction. According to the present embodiment, the power wiring PM1 may provide a supply voltage Vdd, and the power wiring PM2 may be connected to ground.

A vertical transistor such as VFET including a vertical channel structure has a form in which a gate electrode surrounds all sidewalls of the vertical channel structure, and may also be referred to as a gate all around transistor or a vertical fin field effect transistor (VTFET).

The upper active regions 115 and 116, that are also referred to as upper source/drain regions 115 and 116, herein, may be formed on the respective vertical channel structures FF11, FF12, FF21 and FF22. The upper source/drain region 115 may be doped with the same material as the lower source/drain region 111. The upper source/drain region 116 may be doped with the same material as the lower source/drain region 112.

Upper source/drain contacts 120 and 130 may be formed to be spaced apart from each other in the Y direction. A distance between the upper source/drain contacts 120 and 130 in the Y direction may be equal to or greater than a distance between the vertical channel structures FF11 (or FF21) and FF12 (or FF22) in the Y direction. The upper source/drain contact 120 may be formed to entirely cover the upper source/drain regions 115 on the vertical channel structures FF11 and FF21, and may be connected to each of the upper source/drain regions 115. The upper source/drain contact 130 may be formed to entirely cover the upper source/drain regions 116 on the vertical channel structure FF12 and FF22, and may be connected to each of the upper source/drain regions 116. Contact insulation films 121 may also be disposed on bottom surfaces of the upper source/drain contacts 120 and 130 and inner sidewalls of the upper source/drain contacts 120 and 130. At least one surface of the contact insulation films 121 may contact the bottom surfaces and at least one side surface of the upper source/drain contacts 120 and 130. The contact insulation films 121 may include a silicon oxide film, a silicon oxynitride film and/or a high-dielectric constant material. As an example, the high-dielectric constant material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

An interlayer insulation layer 101 may be formed between the upper source/drain contacts 120 and 130, and between the upper source/drain regions 115 and the upper source/drain regions 116. The interlayer insulation layer 101 may include a low-k dielectric material.

An output wiring OM may be electrically connected to the upper source/drain contacts 120 and 130 through vias 167-1 and 167-2 formed on the upper source drain contacts 120 and 130. Each of the vias 167-1 and 167-2 and the output wiring OM may be disposed on a plane together with the interlayer insulation layers 102 and 103.

FIGS. 5A to 5I illustrate a process of forming a cell for an inverter in a plan view, according to an embodiment. FIGS. 5A to 5I show the cell from an FEOL to a BEOL.

FIGS. 5A to 5I sequentially show a process of forming the inverter cell shown in FIG. 1. The inverter may include a pair of PMOS and a pair of NMOS according to the present embodiment.

Figure 5A:
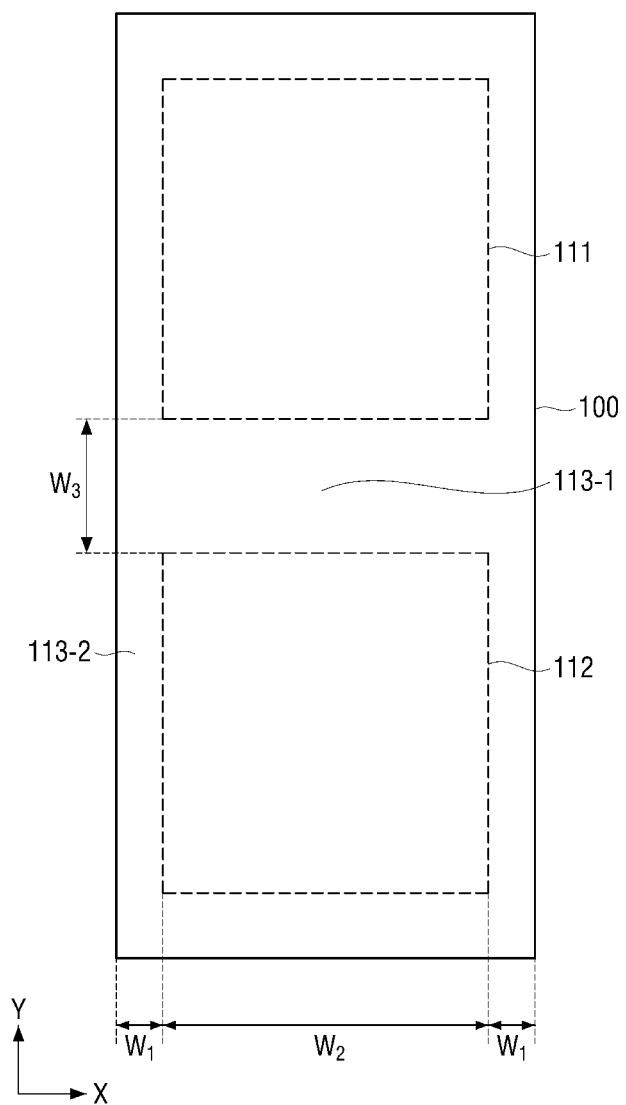

In FIG. 5A, the lower active regions 111 and 112 are defined on the substrate 100 to form lower source/drain regions by doping impurities therein using an ion implantation process or a diffusion process. The substrate 100 may be formed of bulk silicon. For example, although the substrate 100 may include a silicon substrate or Ge, SiGe, SiC, GeP, GeN, InGaAs, GaAs, InSb, InAs, GaSb, and InP, the substrate 100 may include a material other than silicon not limited thereto. The substrate 100 may be a part of a bulk silicon wafer. The substrate 100 may be formed of a silicon-on-insulator (SOI). The substrate 100 may be a silicon part of an SOI wafer. The substrate 100 according to the present embodiment may also refer to a semiconductor layer formed on a base substrate through an epitaxial growth.

The lower active regions 111 and 112 may be formed to be spaced apart from each other in the Y direction. An active region separation film 113-1 may be disposed between the lower active region 111 and the lower active region 112.

According to the present embodiment, the lower active regions 111 and 112 may be formed by etching the substrate 100 to a required depth, using a hard mask pattern (not shown) as an etch mask on the substrate. Subsequently, a semiconductor material layer is formed in a recessed region defined using the semiconductor etching by epitaxial growth, the lower active region 111 is doped with P-type impurities for a PMOS, and the lower active region 112 may be doped with N-type impurities for an NMOS. Alternatively, according to some embodiments, the lower active regions 111 and 112 may be doped with N-type and P-type impurities, respectively.

The P-type impurities are formed of materials such as boron, aluminum and/or gallium. The N-type impurities are formed of materials such as phosphorous, arsenic and/or antimony.

The lower active regions 111 and 112 may be spaced from a boundary of the cell by a distance $W_1$ in the X direction. According to embodiments, since the lower active regions 111 of two adjacent cells are each spaced from the boundary between the two cells by $W_1$, a distance between the lower active regions 111 of the two cells may be $2W_1$. Each of the lower active regions 111 and 112 of the cell may be formed to have a width $W_2$ in the X direction according to embodiments.

The active region separation film 113-1 may extend in the X direction, and may fill a trench that divides the lower active regions 111 and 112. The trench may be filled with an insulating material for forming shallow trench isolation (STI). That is, the active region separation film 113-1 will be explained as an insulating material film disposed inside the cell.

Further, at the boundary between two adjacent cells, a boundary separation film 113-2 may be included between the lower active regions 111 and 112 of the first cell and the lower active regions 111 and 112 of the second cell. The boundary separation film 113-2 may extend in the Y direction and may fill the trench. The trench may be filled with an insulating material. That is, the boundary separation film will be explained as an insulating material film disposed on the outer periphery of the cells.

Figure 5B:
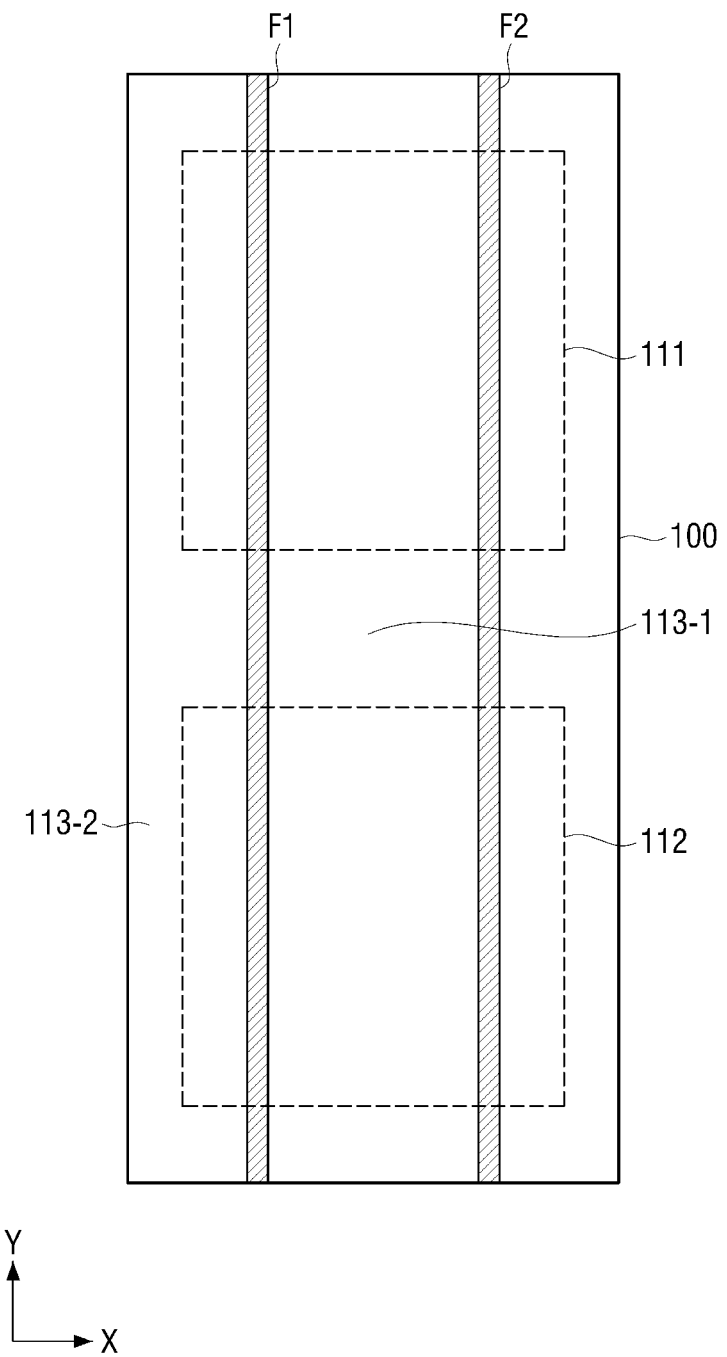

In FIG. 5B, fin regions F1 and F2 may be patterned on the substrate 100 and the lower active regions 111 and 112. The fin regions F1 and F2 may be disposed to intersect the active regions 111 and 112 and the active region separation film 113-1 while extending in the Y direction. The fin region F1 may be spaced apart from the fin region F2 by 1 centered poly pitch (1CPP). The distance between the fin regions F1 and F2 may mean a distance between imaginary Y-direction center lines of the fin regions F1 and F2.

In a plurality of cells, a distance between fin regions may be the same distance. That is, in the first cell and the second cell adjacent to each other, a distance between fin regions (or the outermost fin regions) closest to a boundary of the two cells may be the same as a distance between two adjacent fin regions included in the first cell. That is, each of the adjacent cells may be independently disposed without a cell separation film or a diffusion brake region formed as a dummy at the boundary of the cells.

Lower source/drain regions 111 and 112 may be formed in the lower active regions 111 and 112 by an ion implantation process. Accordingly, herein, the lower active regions 111 and 112 may be referred to as the lower source/drain regions 111 and 112, respectively.

Referring to FIG. 5C, the vertical channel structures FF11, FF12, FF21 and FF22 may be formed in the fin regions F1 and F2 inside the lower source/drain regions 111 and 112 in the plan view. The fin regions F1 and F2 outside the vertical channel structures FF11, FF12, FF21 and FF22 may be wet-etched out using a mask to leave only the vertical channel structures FF11, FF12, FF21 and FF22 in the fin regions F1 and F2. In FIGS. 5B to 5I, however, the fin regions F1 and F2 are still shown to include the wet-etched portions for description convenience. The spacer layer SL shown in FIGS. 2-4 may be formed by a wet etching process.

According to embodiments, if there is a boundary of a cell between two adjacent fin regions, an STI film may be located between the two adjacent fin regions. According to embodiments, if there is no boundary of a cell between two adjacent fin regions, the STI film may not exist between the two adjacent fin regions.

The pair of vertical channel structures FF11 and FF12 may be spaced apart from each other by a distance $W_3$ in the Y direction. The pair of vertical channel structures FF21 and FF22 may be spaced apart from each other by the same distance $W_3$ in the Y direction.

Each of the lower source/drain regions 111 and 112 may include a recess RS formed in an upper part thereof. The recess RS may define the upper part UP and the lower part LP of the lower source/drain regions 111 and 112. A spacer layer SL which fills the recess RS may be provided on the upper parts of the lower source/drain regions 111 and 112. The spacer layer SL may be formed on the upper surface of the STI film.

Each of the lower source/drain regions 111 and 112 is disposed to extend in the Y direction, and may be connected to a bottom contact part to be described later.

Figure 5D:
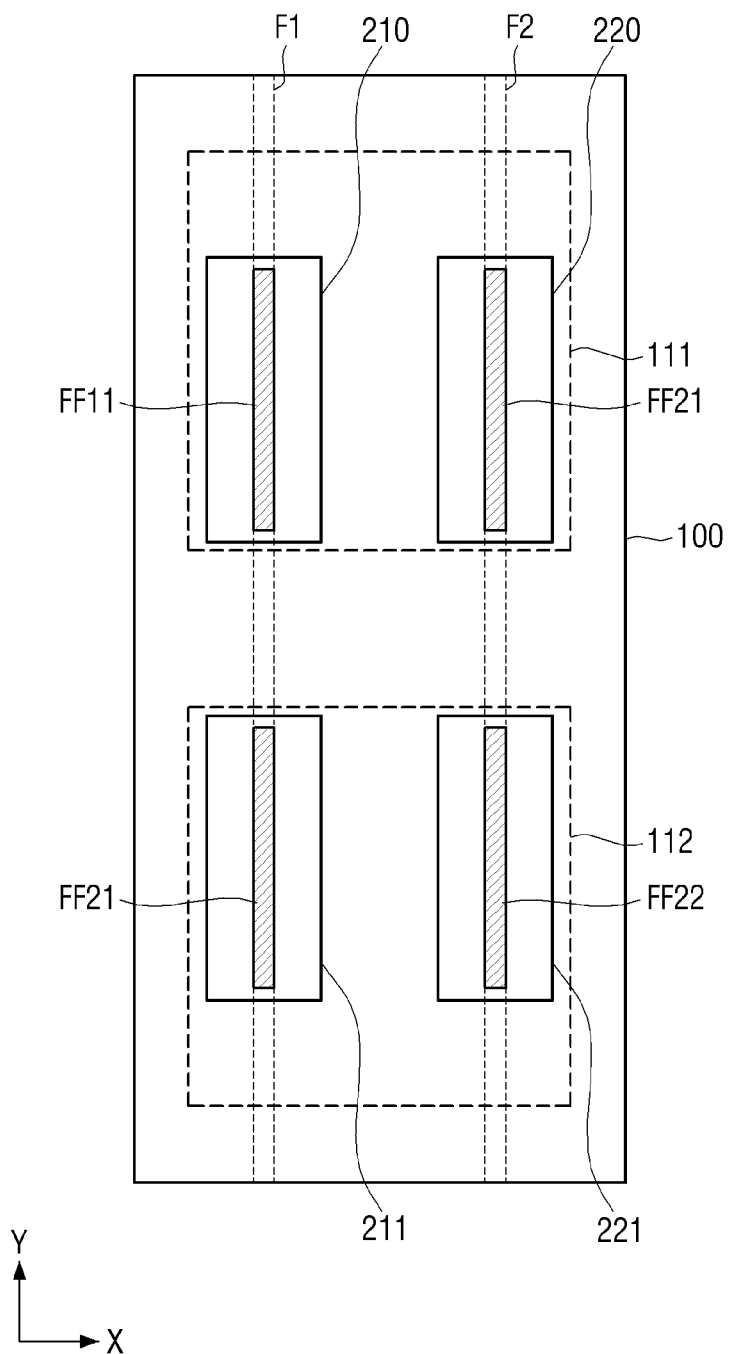

Referring to FIG. 5D, the gate electrodes 210, 211, 220 and 221 which surround the vertical channel structures FF11, FF12, FF21 and FF22 may be formed. Each of the gate electrodes 210, 211, 220 and 221 may have a bar shape or a line shape extending in the Y direction.

Figure 5E:
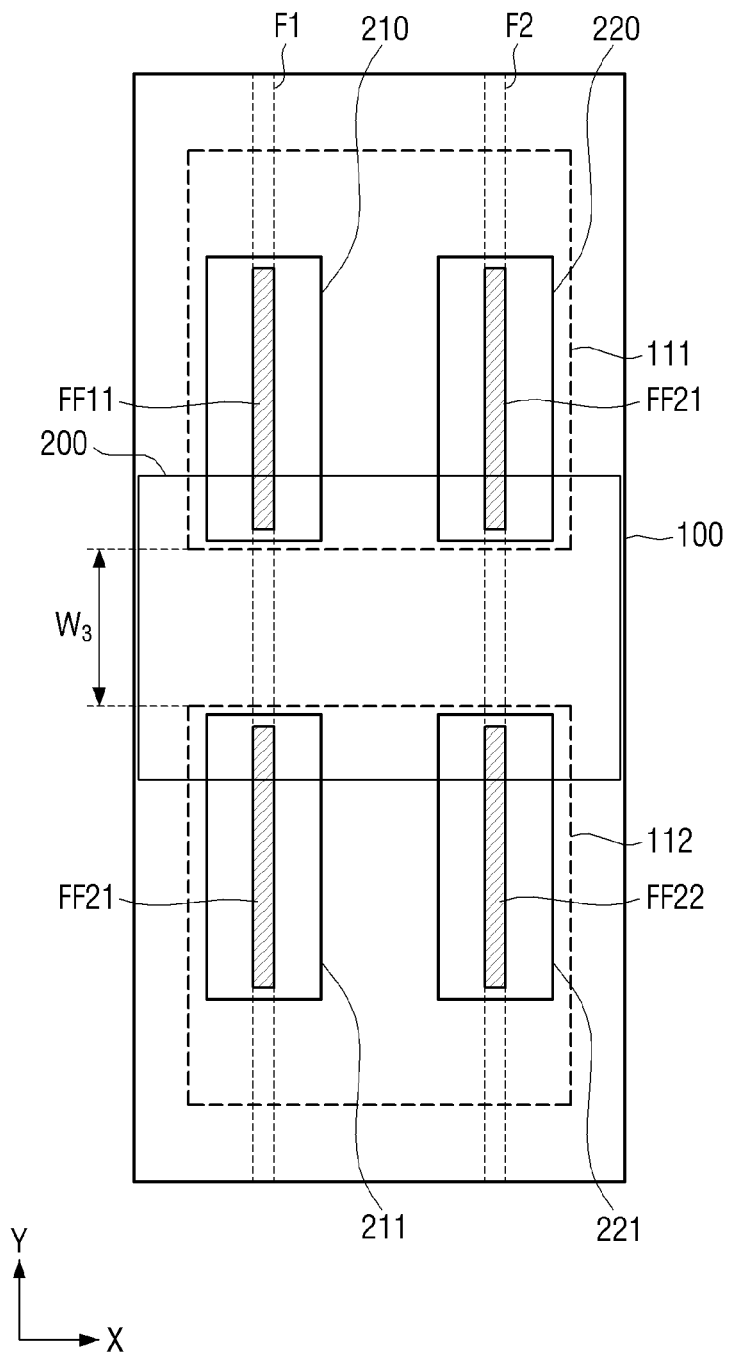

Referring to FIG. 5E, a connection metal layer 200 which connects the gate electrode 210 and the gate electrode 211, and connects the gate electrode 220 and the gate electrode 221 may be formed. The connection metal layer 200 may be formed to partially overlap each of the vertical channel structures FF11, FF12, FF21 and FF22.

According to some embodiments, the gate electrode 210 and the gate electrode 211 may be connected to each other, and the gate electrode 220 and the gate electrode 221 may be connected to each other. According to some embodiments, the gate electrode 210 and the gate electrode 211 are not connected and may be divided, and the gate electrode 220 and the gate electrode 221 are not connected and may be divided and used as separate electrodes.

Figure 5F:
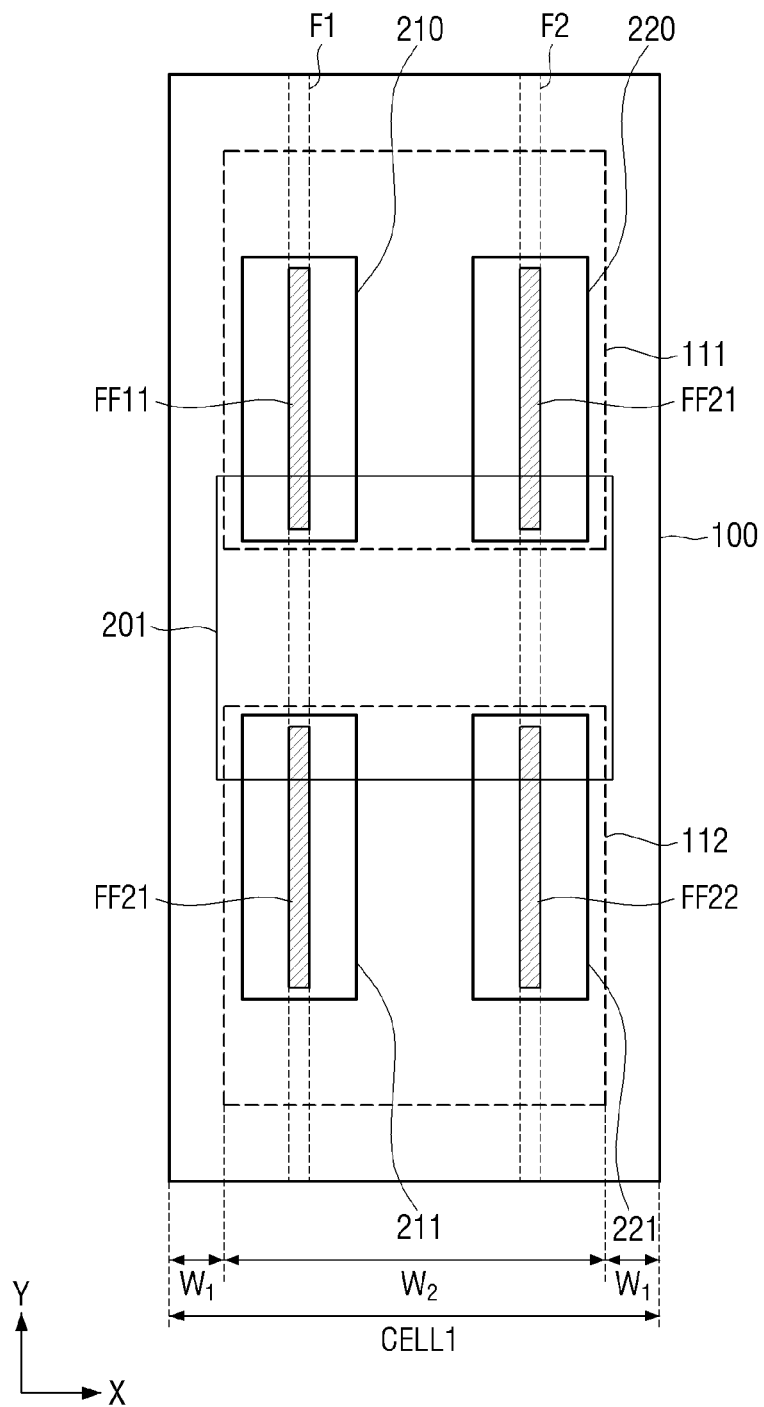

Referring to FIG. 5F, according to the present embodiment, while the connection metal layer 200 is cut to be separated from an adjacent cell at a boundary of the cell, the separated active regions 111 and 112 and the connection metal layer 201 may be electrically independent from the adjacent cell. In the drawing, the connection metal layer 200 may be cut on both side surfaces to be spaced apart by $W_1$ from the boundary of the cell. The cut connection metal layer 201 according to the present embodiment may have a width of $W_2$ in the X-axis direction and both side surfaces thereof may be spaced apart by $W_1$ from the cell boundary.

Figure 5G:
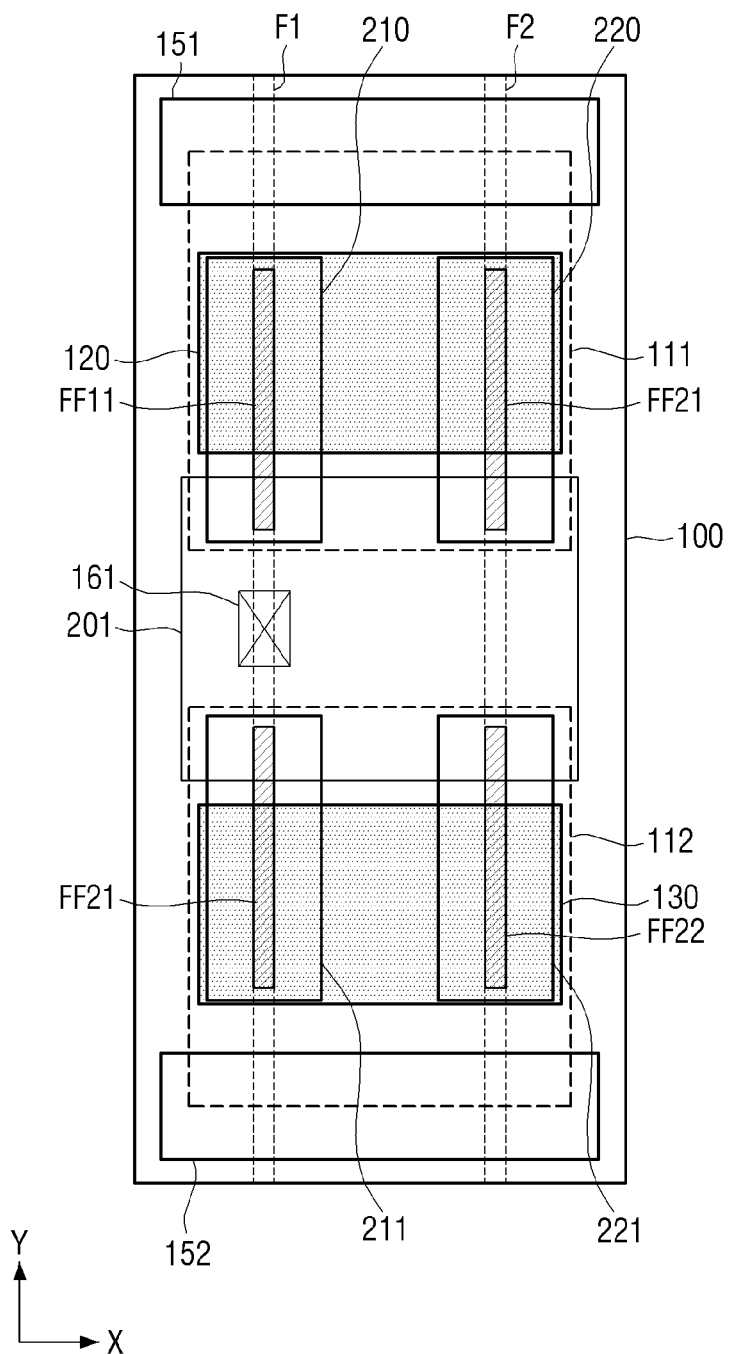

In FIG. 5G, a gate contact 161 may be formed on the connection metal layer 201 intersecting the fin region F1. Also, the upper source/drain contacts 120 and 130 may be formed on the upper source/drain regions 115 and 116, respectively. Also, lower source/drain contacts 151 and 152 may be formed on the lower source/drain regions 111 and 112 extending in the Y-axis direction.

The upper source/drain contact 120 extends in the X direction to intersect both the vertical channel structure FF11 and the vertical channel structure FF21, and may be formed to have the same as or narrower than the width $W_2$ of the lower active region 111 in the X direction. The upper source/drain contact 130 extends in the X direction to intersect both the vertical channel structure FF12 and the vertical channel structure FF22, and may be formed to have the same as or narrower than the width $W_2$ of the lower active region 112 in the X direction.

The upper source/drain contact 120 may be formed to overlap at least a partial region of the upper source/drain region 115 in the Y direction. That is, a distance $W_4$ between the upper source/drain contact 120 and the upper source/drain contact 130 in the Y direction may be the same as or greater than the distance $W_3$ between the vertical channel structure FF11 and the vertical channel structure FF21.

The lower source/drain contacts 151 and 152 may be formed to be electrically connected to the lower source/drain regions 111 and 112, respectively. The lower source/drain contacts 151 and 152 may include a conductive material such as metal.

According to the present embodiment, the upper source/drain contacts 120 and 130 and the lower source/drain contacts 151 and 152 may include the same material. According to some embodiments, the upper source/drain contacts 120 and 130 and the lower source/drain contacts 151 and 152 may be formed simultaneously in the same process. The upper source/drain contacts 120 and 130 and the lower source/drain contacts 151 and 152 may be formed on the upper surface of the substrate 100 substantially at the same height as shown in FIGS. 2 and 3.

Figure 5H:
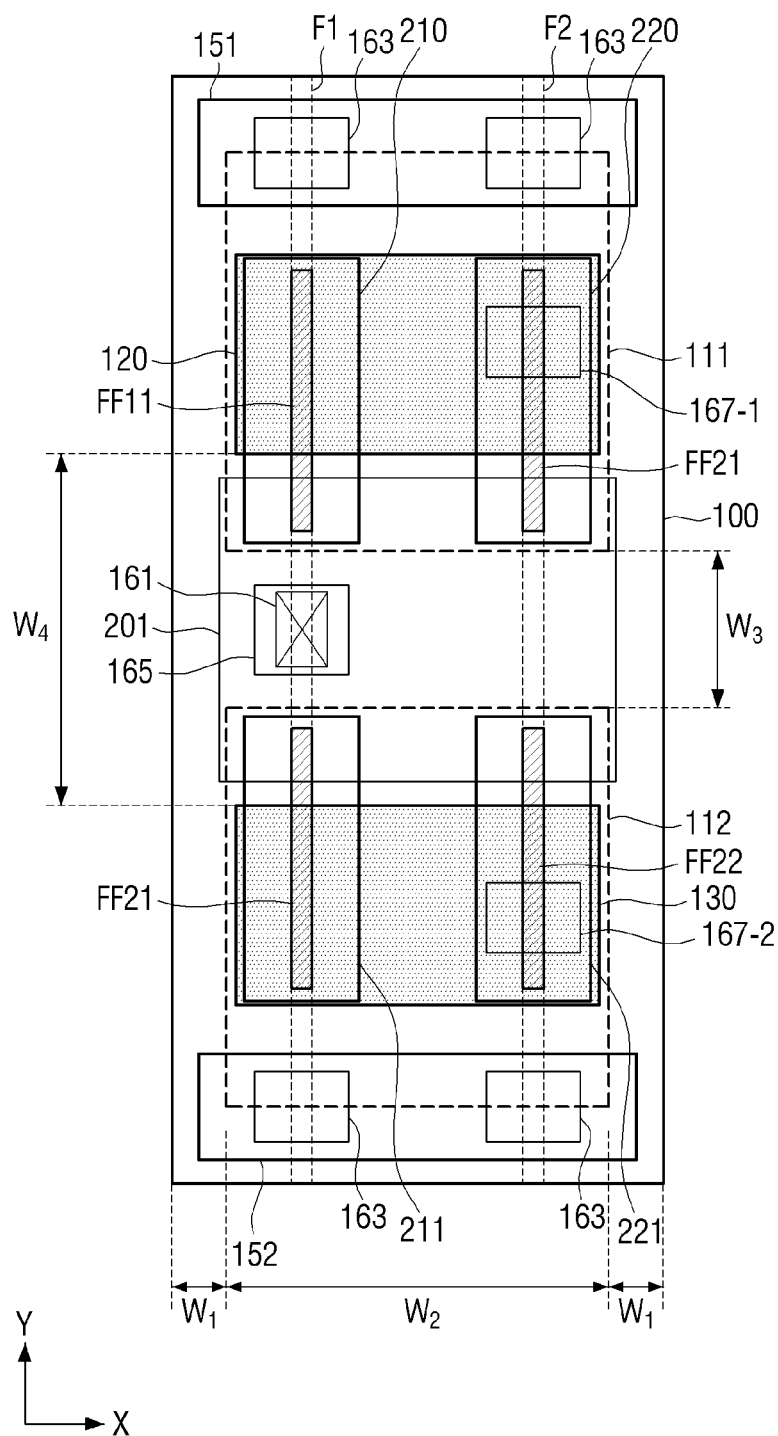

In FIG. 5H, a plurality of vias 165, 163, 167-1 and 167-2 may be formed on upper surfaces of the gate contact 161, the lower source/drain contacts 151 and 152, and the upper source/drain contacts 120 and 130, respectively.

Figure 5I:
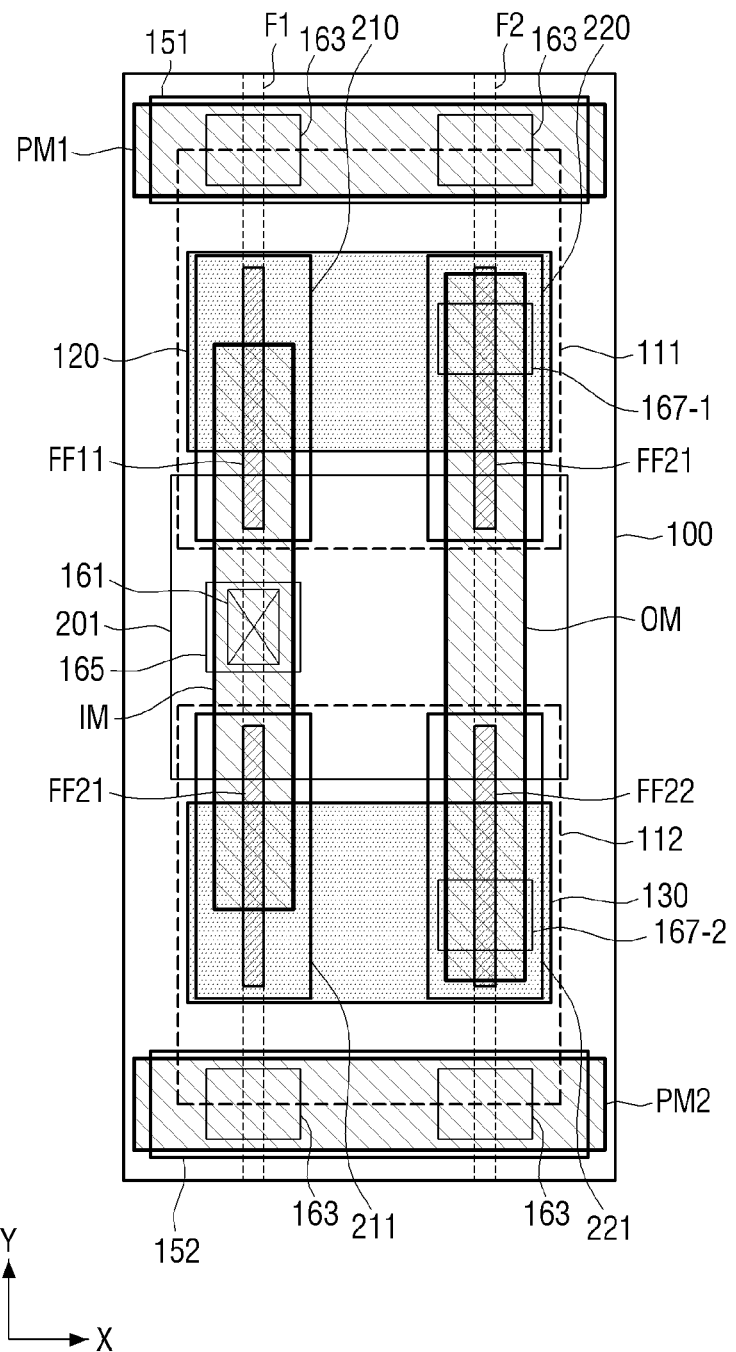

In FIG. 5I, a plurality of metal wirings may be formed to correspond to the vias 165, 163, 167-1 and 167-2.

The input wiring IM may be formed on the gate via 165 to extend in the Y direction to be connected to the gate contact 161 through the gate via 165. The output wiring OM may be formed on the upper source/drain via 167-1 and the upper source/drain via 167-2 to extend in the Y direction to be simultaneously connected to the upper source/drain contacts 120 and 130.

A power wiring PM1 is disposed on the lower source/drain contact 151 to be connected to the lower source/drain region 111, and may be connected through at least one lower source/drain via 163. A power wiring PM2 is disposed on the lower source/drain contact 152 to be connected to the lower source/drain region 112 and may be connected through another at least one lower source/drain via 163.

Figure 6:
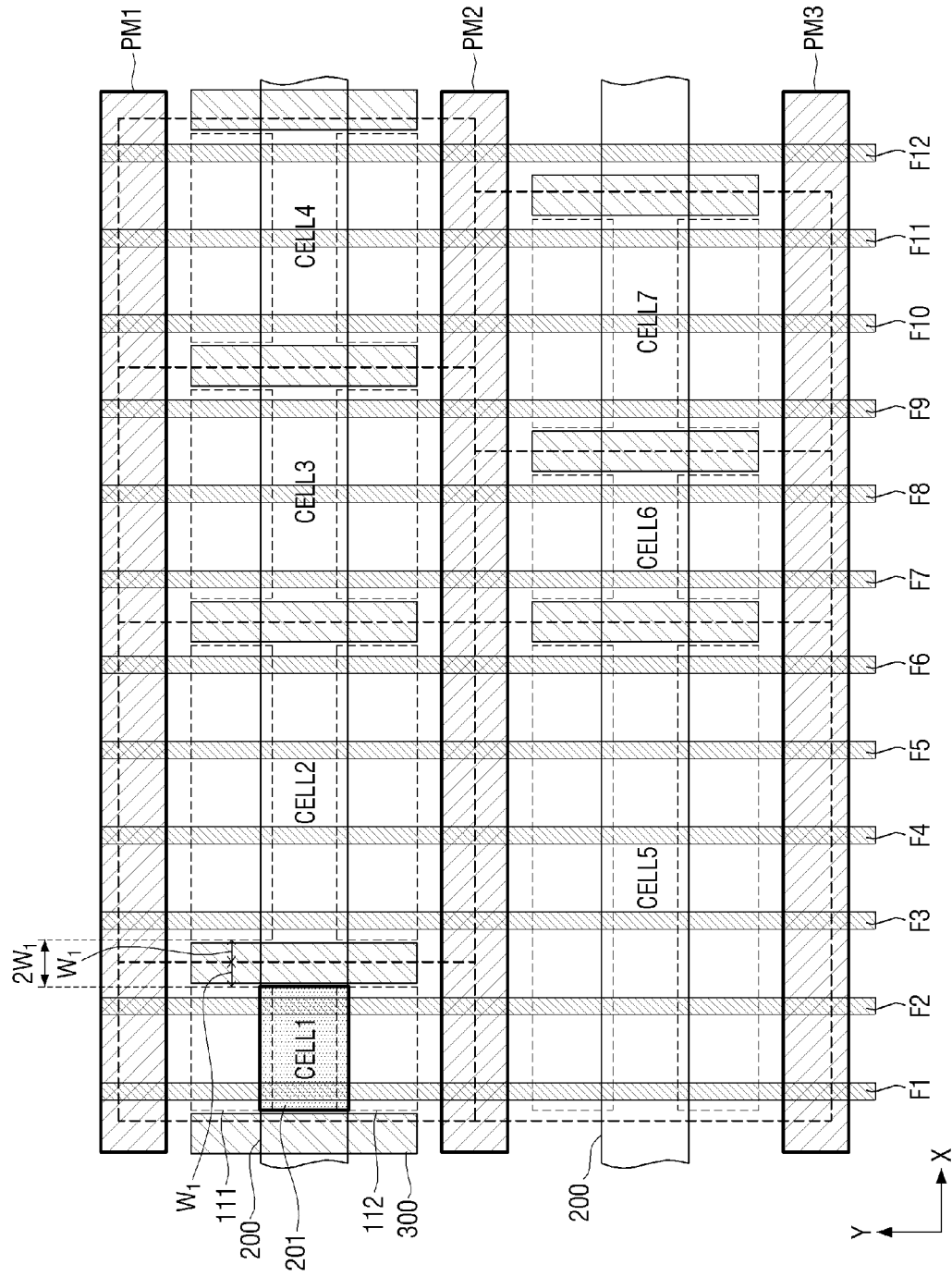
FIG. 6 is a layout of a plurality of standard cells for an integrated circuit in a plan view, according to an embodiment.

FIG. 6 is a layout of a plurality of cells for an integrated circuit in a plan view, according to an embodiment.

The cells according to the present embodiment may include at least one PMOS and at least one NMOS that are formed over at least two fin regions. That is, the cells may include a multi-gate NMOS and a multi-gate PMOS. Here, the PMOS and the NMOS may be VFETs.

FIG. 6 shows an integrated circuit formed of seven cells CELL1 to CELL7 including fin regions F1 to F12. For convenience of explanation, it is assumed that each of CELL1 to CELL7 is implemented as a single height cell including lower active regions 111 and 112, and at least two vertical channel structures between two power wirings PM1 and PM2.

According to various embodiments, a cell may be implemented as a multi-height cell which includes at least three or more power wirings and at least two active regions.

Referring to FIG. 6, the lower active regions 111 and 112, which are lower source/drain regions, of a cell are formed to have a predetermined distance from an adjacent cell. On the basis of a boundary between CELL1 and CELL2 according to the present embodiment, the lower active regions 111 and 112 of CELL1 may be formed to be spaced part from corresponding lower active regions 111 and 112 of CELL2 by a preset minimum distance $2W_1$ in the X direction.

A connection metal layer 200 is cut by a metal cutting pattern 300 to have a predetermined distance on the basis of the boundary between CELL1 and CELL2. The width (the length in the X direction) of the metal cutting pattern 300 may be smaller than or equal to $2W_1$. According to the present embodiment, the connection metal layer 201 of CELL1 after the cutting may be formed to be spaced apart from a connection metal layer 201 of CELL2 after the cutting by a preset distance $2W_1$.

According to the embodiment described herein, a distance between two facing outermost fin regions of two adjacent cells is 1CPP which may be equal to or greater than a distance between two adjacent fin regions in each of the cells. In FIG. 6, a distance between a fin region F2 of CELL1 and a fin region F3 of CELL2 according to the present embodiment is 1CPP, which may be the same as a distance between other fin regions (e.g., F1 and F2, and F3 and F4) of CELL1 and CELL2. That is, the cells may be placed such that a dummy fin region or an additional diffusion brake region is not formed at a boundary between the standard cells. Similarly, a distance between outermost fin regions F6 and F7 formed at a boundary between CELL2 and CELL3, a distance between outermost fin regions F9 and F10 formed at a boundary between CELL3 and CELL4, a distance between outermost fin regions F6 and F7 formed at a boundary between CELL5 and CELL6, and a distance between outermost fin regions F8 and F9 formed at a boundary between CELL6 and CELL7 may be the same as a distance between two adjacent fin regions in each of the cells CELL1 to CELL7, which is 1CPP.

According to the embodiments describe herein, fin regions are regularly disposed without a dummy fin region or a diffusion brake region, and by distinguishing a boundary of a cell, a layout error occurring on the cell boundary can be reduced, and thus, design of an integrated circuitry may be more error-free. Also, even when an engineering change order cell (ECO), a filler cell, a tap cell or the like is additionally provided between cells, a distance between fin regions at a cell boundary can be regularly spaced apart.

Further, in the VFET, the fin protruding vertically from the substrate may function as a channel, and the structure surrounding the sidewall of the fin may function as a gate. Therefore, the upper source/drain contact connected to the upper source/drain region of the VFET, and the lower source/drain contact connected to the lower source/drain region of the VFET may be less affected by the area occupied by the gate, as compared to conventional planar or horizontal field effect transistors.

A multi-gate VFET according to embodiments has two or more vertical channel structures each acting as a channel of the VFET, and gate-all-around structures surrounding the vertical channel structures act as the gates which may be connected to each other using gate connections. Therefore, the multi-gate VFET may provide a wider area for each of the gate contact structure, the upper source/drain contact and/or the lower source/drain contact, as compared to a single gate VFET or a conventional planar or horizontal field effect transistor.

Figure 7A:
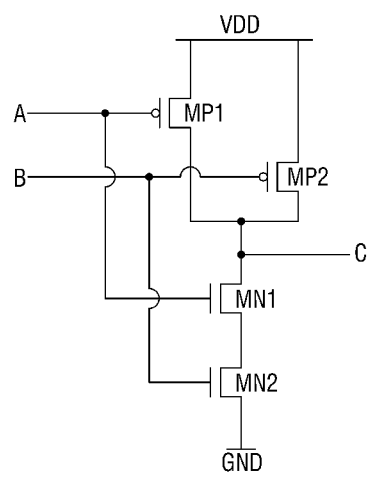
FIG. 7A is a schematic of a NAND circuit.
Figure 7B:
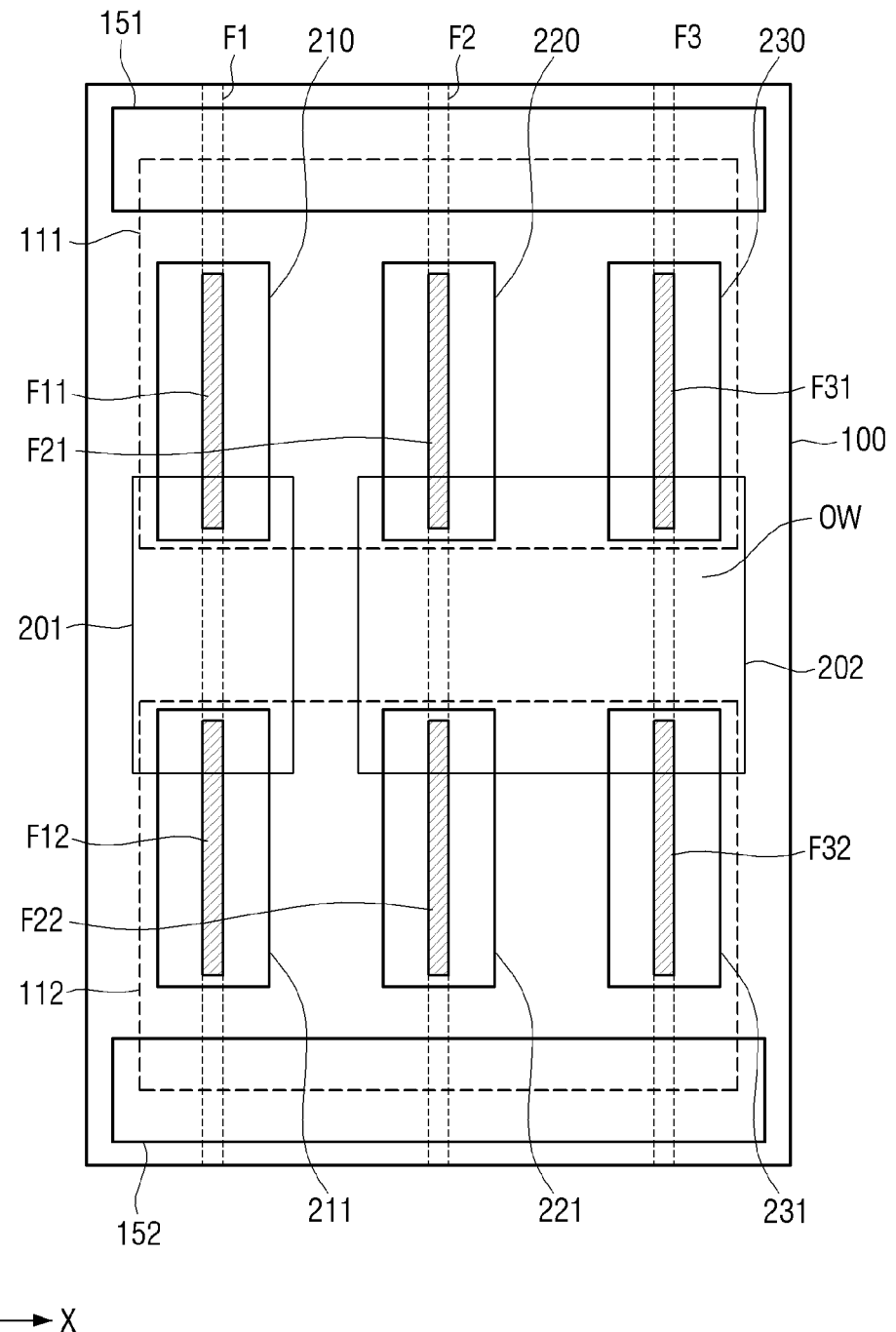
FIGS. 7B to 7D illustrate layouts of a standard cell for the NAND circuit in a plan view, according to embodiments.
Figure 7C:
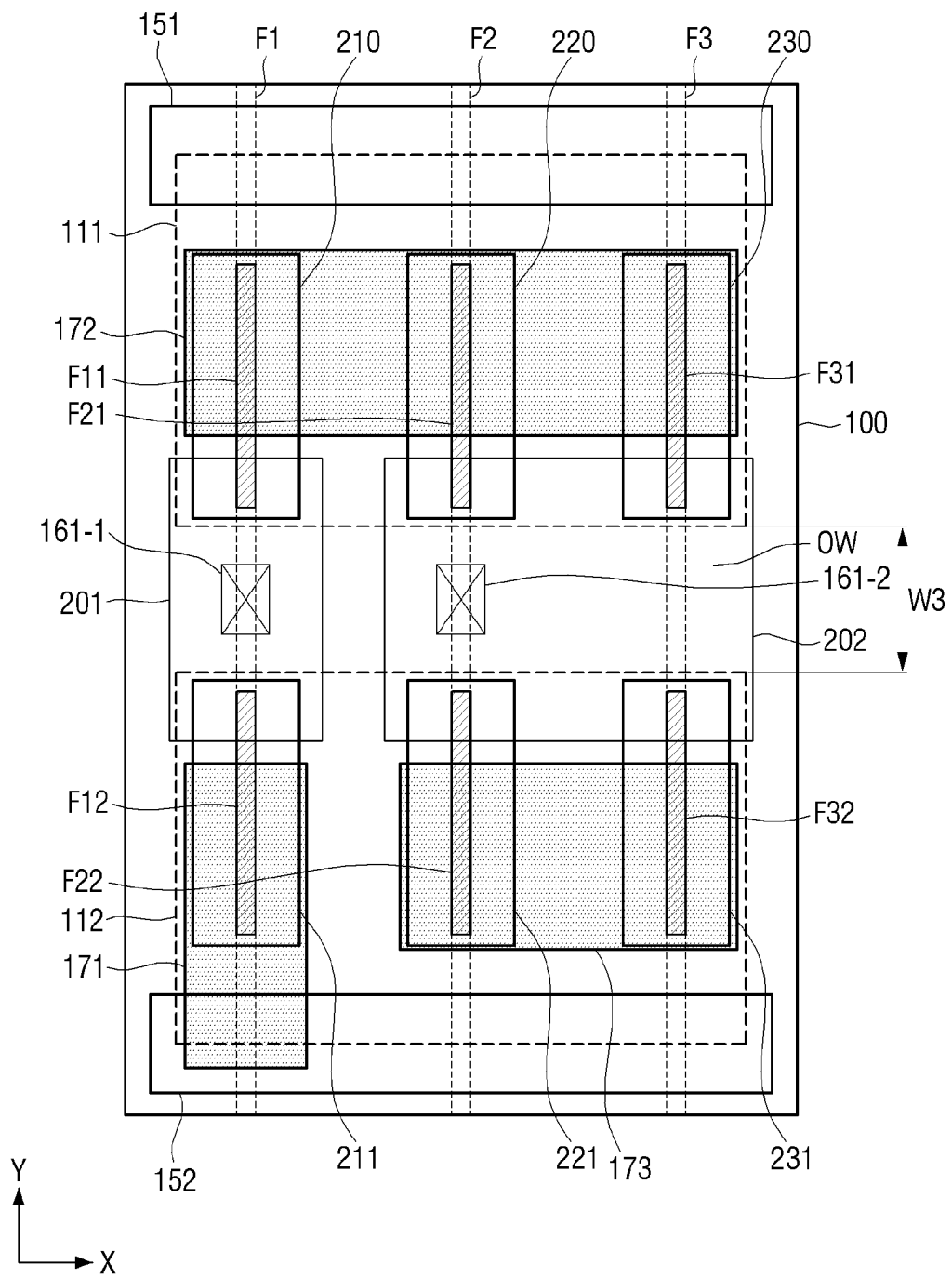
Figure 7D:
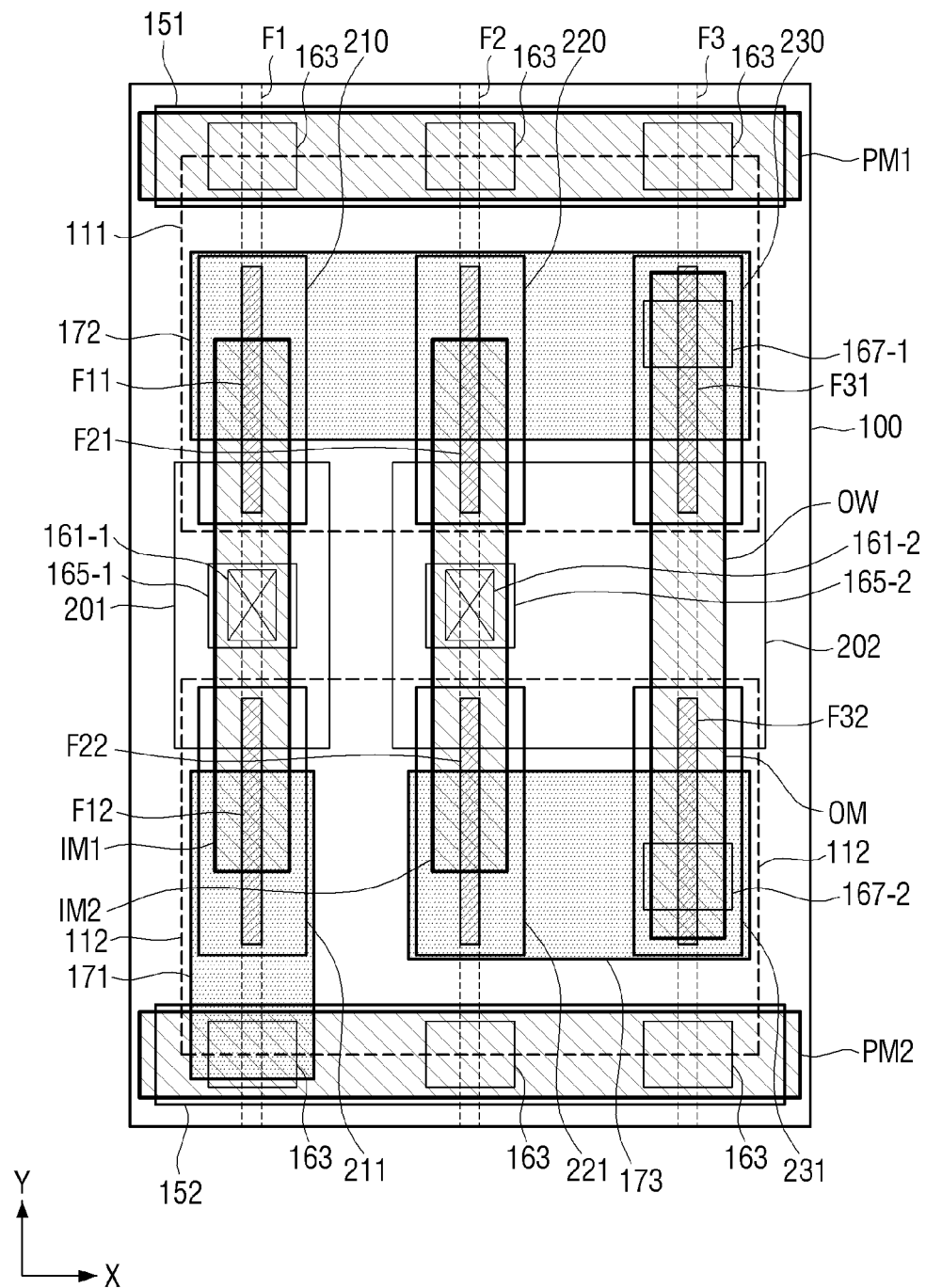

FIG. 7A is a schematic of a NAND circuit, and FIGS. 7B to 7D illustrate layouts of a cell for the NAND circuit in a plan view, according to embodiments. Specifically, FIG. 7B is a layout showing up to an FEOL of the cell, FIG. 7C is a layout showing up to a middle-of-line (MOL) of the cell, and FIG. 7D is a layout showing up to a BEOL of the cell.

In FIG. 7A, the NAND circuit includes two PMOSs MP1 and MP2 connected in parallel between a power supply voltage terminal (VDD) and an output node, and two NMOSs MN1 and MN2 connected in series between the output node and a ground voltage terminal (GND). Here, each of the PMOSs and NMOSs is implemented by a VFET. In the NAND circuit, the PMOS MP1 and the NMOS MN1 receive an input signal A at their gates, the PMOS MP2 and the NMOS MN2 receive an input signal B at their gates, and an output signal C is output through the output node.

In FIG. 7B, the NAND cell may include three fin regions F1, F2 and F3. A distance between the fin regions F1, F2 and F3 may be 1CPP, and a distance between the fin region F1 or F3 and an outermost fin region (not shown) of an adjacent cell may also be 1CPP. The NAND cell may include a pair of vertical channel structures F11 and F12 in the fin region F1, a pair of vertical channel structures F21 and F22 in the fin region F2, and a pair of vertical channel structures F31 and F32 in the fin region F3. As described above, each of the vertical channel structure F11 to F32 forms a vertical channel of a corresponding VFET.

A lower active region 111 may be formed below the vertical channel structure F11, F21 and F31, and doped with P-type impurities according to the present embodiment. A lower active region 112 may be formed below the vertical channel structures F21, F22 and F32, and doped with N-type impurities according to the present embodiment. Thus, the lower active regions 111 and 112 may function as respective lower source/drain regions.

A spacer layer SL (not shown) may be formed on the lower active regions 111 and 112 at around the vertical channel structures F11, F12, F21, F22, F31 and F32, respectively. The spacer layer SL may also be formed on sidewalls of upper parts of the lower active regions 111 and 112. Gate electrodes 210, 211, 220, 221, 230 and 231 may be formed on the spacer layer SL. The gate electrodes 210, 211, 220, 221, 230 and 231 may surround sidewalls of the vertical channel structures F11, F12, F21, F22, F31 and F32. The gate electrodes 210, 211, 220, 221, 230 and 231 may be spaced apart from the lower active regions 111 and 112 by the spacer layer SL.

A connection metal layer 201 may connect the gate electrodes 210 and 211. A connection metal layer 202 may connect the gate electrodes 220, 221, 230 and 231. The connection metal layers 201 and 202 may be cut along a metal cutting pattern (not shown) to be spaced apart from each other and from a connection metal layer of an adjacent cell, if any. The connection metal layers 201 and 202 may be spaced apart from each other in the X direction, and receive the input signals A and B, respectively, for the NAND circuit of FIG. 7A.

Referring to FIG. 7C, lower source/drain contacts 151 and 152 may be respectively formed on the lower active regions 111 and 112, which are lower source/drain regions, extending in the Y-axis direction of the NAND standard cell.

In FIG. 7C, an upper source/drain contact 172 may be extended in the X direction to be formed on an upper source/drain region (not shown) above the vertical channel structures F11, F21 and F31 for parallel connection of the PMOSs MP1 and MP2 shown in FIG. 7A. An upper source/drain contact 171 may be formed on an upper source/drain region (not shown) above the vertical channel structure F12.

An upper source/drain contact 173 may be extended in the X direction to be placed above the vertical channel structures F22 and F32. The upper source/drain contact 171 may be placed to extend in the Y direction up to an upper surface of the lower source/drain contact 152. The upper source/drain contact 173 may be placed so as not to overlap the lower source/drain contact 152 in the Z direction. That is, a length of the upper source/drain contact 171 is greater than a length of the upper source/drain contact 173 in the Y direction. That is, the upper source/drain contacts 171 and 173 may be separately formed for the serial connection of the NMOSs MN1 and MN2 shown in FIG. 7A.

The lower active regions 111 and 112 may be placed to be spaced apart from each other by a distance $W_3$ in the Y direction, and the connection metal layers 201 and 202 may be formed between the active region 111 and the active region 112.

The connection metal layer 201 may be placed between the vertical channel structures F11 and F12 the vertical channel structure F12, and the connection metal layer 202 may be placed between the vertical channel structures F21, F22, F31 and F32. The connection metal layer 202 may extend in the X direction to be placed above the fin regions F2 and F3.

In FIG. 7D, power wirings PM1 and PM2 may be extended in the X direction and connected to the lower source/drain contacts 151 and 152, respectively, through the lower source/drain vias 163. The power wirings PM1 and PM2 may be formed on a level in the Z direction which is the same as or different from a level of input wirings IM1 and IM2 and an output wiring OM, according to embodiments. If the lower active region 111 is P-type doped, a power supply voltage VDD may be applied to the power wiring PM1, and if the lower active region 112 is N-type doped, a ground voltage GND may be applied to the power wiring PM2.

The input wiring IM1 may be extended in the Y direction and connected to the connection metal layer 201 through a gate via 165-1. The input wiring IM1 may be placed to be parallel with the fin region F1 in the Y direction and overlap a portion of the fin region F1. The input signal A of the NAND circuit of FIG. 7A may be input to the input wiring EVIL The input wiring IM2 may be extended in the Y direction and connected to the connection metal layer 202 through a gate via 165-2. The input wiring IM2 may be formed to be parallel with the fin region F2 in the Y direction and overlap a portion of the fin region F2 in the plan view. The input signal B of the NAND circuit of FIG. 7A may be input to the input wiring IM2.

The output wiring OM may be formed to be parallel with the fin region F3 in the Y direction and overlap a portion of the fin region F3 in the plan view. The output wiring OM may be connected to the upper source/drain contacts 172 and 173 through upper source/drain vias 167-1 and 167-2, respectively. The output signal C of the NAND circuit of FIG. 7A may be output to an upper wiring (not shown) through an output via (not shown) formed on the output wiring OM.

Figure 8A:
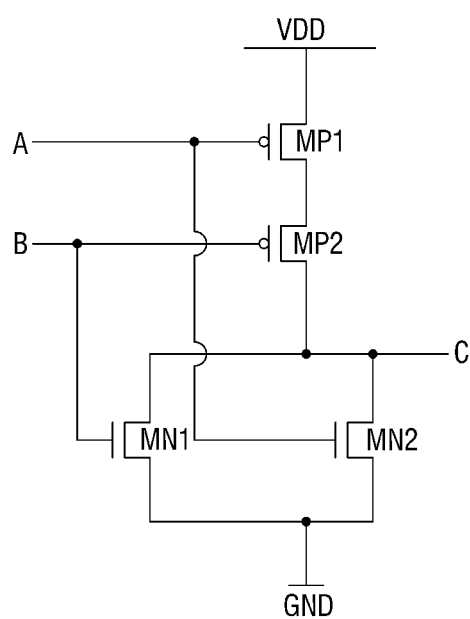
FIG. 8A is a schematic of a NOR circuit.
Figure 8B:
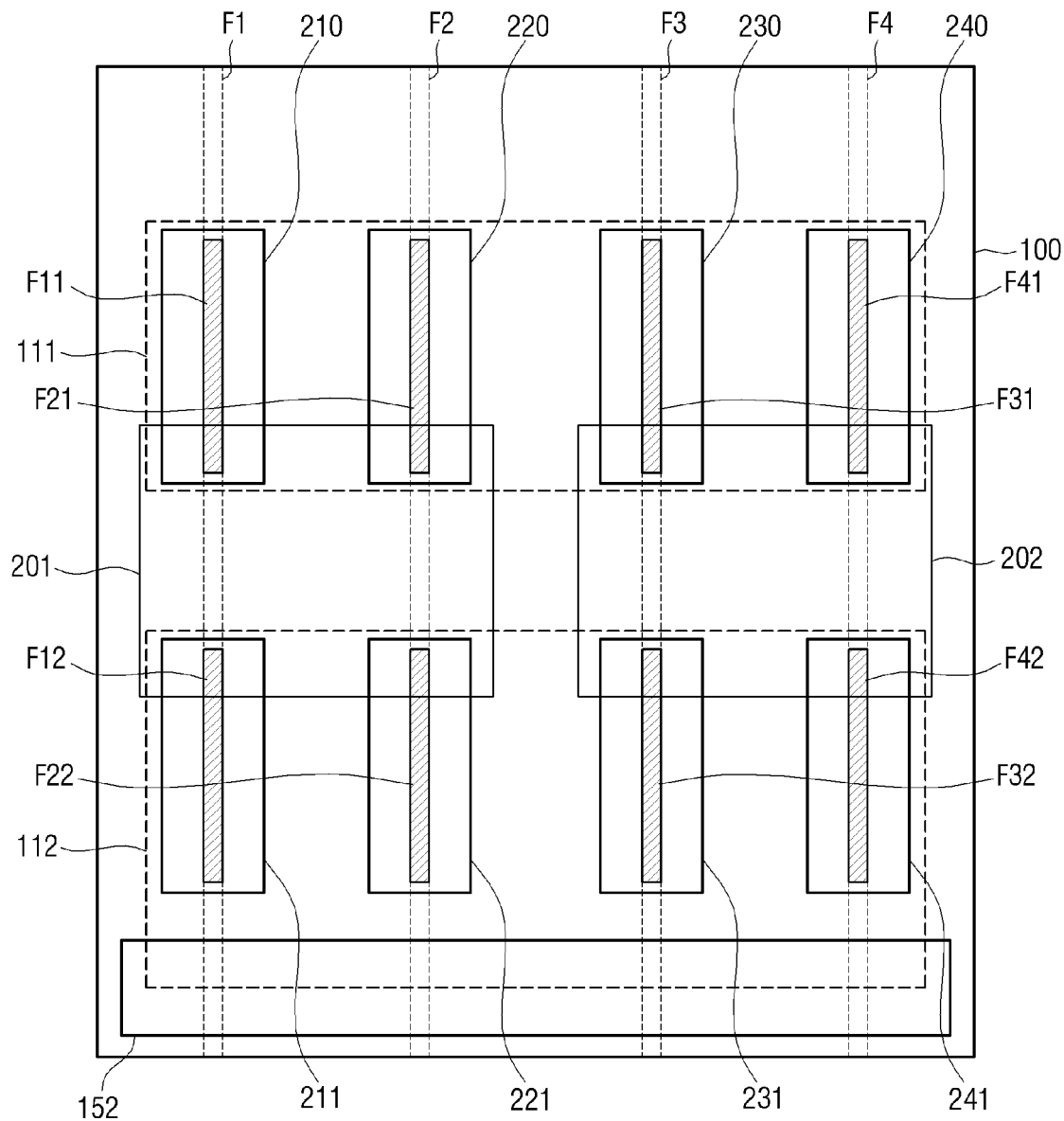
FIGS. 8B to 8D illustrate layouts of a standard cell for the NOR circuit in a plan view, according to embodiments.
Figure 8C:
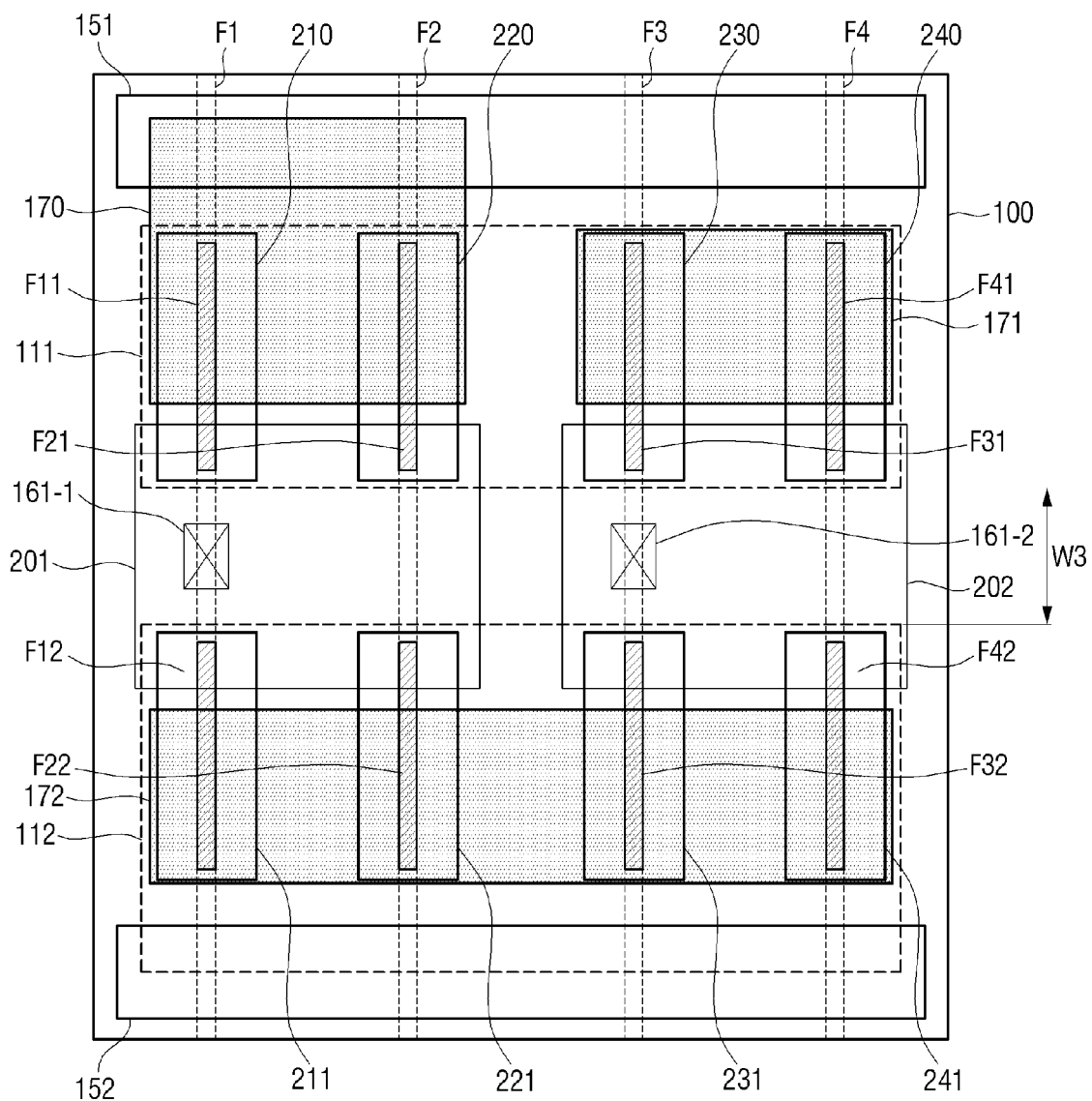
Figure 8D:
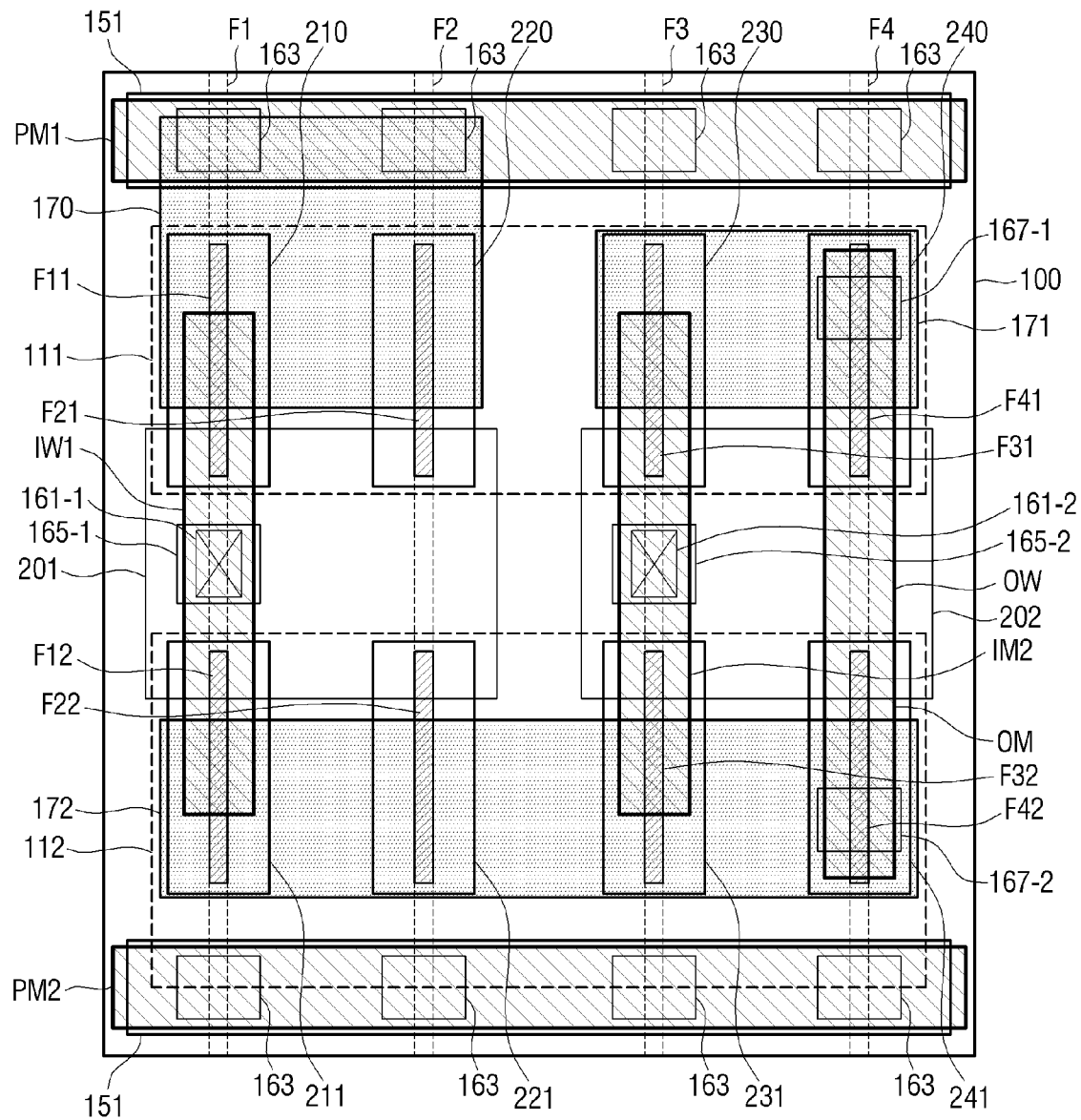

FIG. 8A is a schematic of a NOR circuit, and FIGS. 8B to 8D illustrate layouts of a cell for the NOR circuit in a plan view, according to embodiments. Specifically, FIG. 8B is a layout showing up to an FEOL of the cell, FIG. 8C is a layout showing up to an MOL of the cell, and FIG. 8D is a layout showing up to a BEOL of the cell.

In FIG. 8A, the NOR circuit includes two PMOS MP1 and MP2 connected in series between a supply voltage terminal (VDD) and an output node, and two NMOS MN1 and MN2 connected in parallel between the output node and a ground voltage terminal (GND). Here, each of the PMOSs and NMOSs is implemented by a VFET. In the NOR circuit, the PMOS MP1 and the NMOS MN2 receive an input signal A at their gates, the PMOS MP2 and the NMOS MN1 receive an input signal B at their gates, and an output signal C is output through the output node.

In FIG. 8B, the NOR cell may include four fin regions F1, F2, F3 and F4. A distance between the fin regions F1, F2, F3 and F4 may be 1CPP, and a distance between the fin region F1 or F4 and an outermost fin region (not shown) of an adjacent cell may also be 1CPP. The NOR cell may include a pair vertical channel structures F11 and F12 in the fin region F1, a pair of vertical channel structures F21 and F22 in the fin region F2, a pair of vertical channel structures F31 and F32 in the fin region F3, and a pair of vertical channel structures F41 and F42 in the fin region F4. As described above, each of the vertical channel structures F11 to F42 forms a vertical channel of a corresponding VFET.

A lower active region 111 may be formed below the vertical channel structures F11, F21, F31 and F41, and doped with P-type impurities according to the present embodiment. A lower active region 112 may be placed under the vertical channel structures F12, F22, F32 and F42, and doped with N-type impurities according to the present embodiment. Thus, the lower active regions 111 and 112 may function as respective low source/drain regions.

A spacer layer SL (not shown) may be formed on the lower active regions 111 and 112 at around the vertical channel structures F11, F12, F21, F22, F31, F32, F41 and F42, respectively. The spacer layer SL may also be formed on sidewalls of upper parts of the lower active regions 111 and 112. Gate electrodes 210, 211, 220, 221, 230, 231, 240 and 241 may be formed on the spacer layer SL. The gate electrodes 210, 211, 220, 221, 230, 231, 240 and 241 may surround sidewalls of the vertical channel structures F11, F12, F21, F22, F31, F32, F41 and F42, respectively. The gate electrodes 210, 211, 220, 221, 230, 231, 240 and 241 may be spaced apart from the lower active regions 111 and 112 by the spacer layer SL.

A connection metal layer 201 may connect the gate electrodes 210, 211, 220 and 221. A connection metal layer 202 may connect the gate electrodes 230, 231, 240 and 241. The connection metal layers 201 and 202 may be cut along a metal cutting pattern (not shown) to be spaced apart from each other and from an adjacent connection metal layer of another cell, if any. The connection metal layers 201 and 202 may be spaced apart from each other in the X direction, and receive the input signals A and B, respectively, for the NOR circuit of FIG. 8A.

Referring to FIG. 8C, lower source/drain contacts 151 and 152 may be respectively formed on the lower active regions 111 and 112, which are lower source/drain regions, extending in the Y-axis direction of the NOR cell.

In FIG. 8C, upper source/drain contacts 170 and 171 may be formed to be spaced apart from each other in the X direction for serial connection of the PMOS s MP1 and MP2 shown in FIG. 8A. The upper source/drain contact 170 may be formed on an upper source/drain region (not shown) above the vertical channel structures F1/ and F21, and the upper source/drain contact 171 may be formed on an upper source/drain region (not shown) above the vertical channel structures F31 and F41.

The upper source/drain contact 170 may be placed to extend in the Y direction up to an upper surface of the lower source/drain contact 151. That is, the upper source/drain contact 170 may be placed to overlap the lower source/drain contact 151 in the Z direction. The upper source/drain contact 171 may be placed so as not to overlap the lower source/drain contact 151 in the Z direction. That is, a length of the upper source/drain contact 170 is greater than a length of the upper source/drain contact 171 in the Y direction.

The upper source/drain contact 172 may be formed to extend in the X direction for parallel connection of the NMOSs MN1 and MN2 shown in FIG. 8A and disposed on an upper source/drain region (not shown) above the vertical channel structures F12, F22, F32 and F42.

Referring to FIGS. 8A and 8C, the upper source/drain contact 170 may correspond to a source terminal of the PMOS MP1, the upper source/drain contact 171 may correspond to a drain terminal of the PMOS MP2, and the upper source/drain contact 172 may correspond to drain terminals of the NMOSs MN1 and MN2.

The lower active regions 111 and 112 may be placed to be spaced apart from each other by a distance $W_3$ in the Y direction, and each of the connection metal layers 201 and 202 may be placed between the lower active regions 111 and 112.

The connection metal layer 201 may be placed between the vertical channel structures F11, F21, F12 and F22. That is, the connection metal layer 201 may extend in the X direction to be placed over the fin regions F1 and F2. The connection metal layer 202 may be placed between the vertical channel structures F31, F41, F32 and F42. That is, the connection metal layer 202 may extend in the X direction to be placed over the fin regions F3 and F4.

A gate via 161-1 may be placed on an upper surface of the connection metal layer 201 corresponding to the fin region F1. A gate via 161-2 may be placed on an upper surface of the connection metal layer 202 corresponding to the fin region F3.

In FIG. 8D, power wirings PM1 and PM2 may be extended in the X direction and connected to the lower source/drain contacts 151 and 152, respectively, through lower source/drain vias 163. The power wirings PM1 and PM2 may be formed on a level in the Z direction which is the same as or different from a level of input wirings IM1 and IM2 and an output wiring OM, according to some embodiments. If the lower active region 111 is P-type doped, a power supply voltage VDD may be applied to the power wiring PM1, and if the lower active region 112 is N-type doped, a ground voltage GND may be applied to the power wiring PM2.

The input wiring IM1 may be extended in the Y direction and connected to the connection metal layer 201 through the gate via 161-1. The input wiring IM1 may be placed to be parallel with the fin region F1 in the Y direction and overlap a portion of the fin region F1 in the Z direction. The input signal A of the NOR circuit of FIG. 8A may be input to the input wiring EVIL The input wiring IM2 may be extended in the Y direction and be connected to the connection metal layer 202 through a gate via 161-2. The input wiring IM2 may be placed to be parallel with the fin region F3 in the Y direction and overlap a portion of the fin region F3 in the plan view. The input signal B of the NOR circuit of FIG. 8A may be input to the input wiring IM2.

The output wiring OM may be formed to be parallel with the fin region F4 in the Y direction and overlap a portion of the fin region F4 in the plan view. The output wiring OM may be connected to the upper source/drain contacts 171 and 172 through upper source/drain vias 167-1 and 167-2, respectively. The output signal C of the NOR circuit of FIG. 8A may be output to an upper wiring (not shown) through an output via (not shown) placed on the output wiring OM.

Figure 9A:
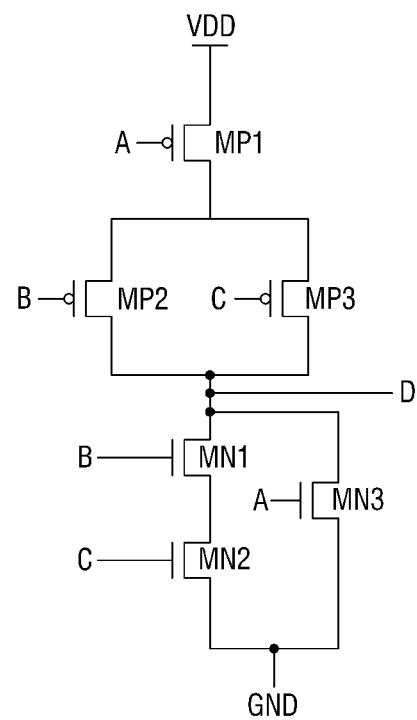
FIG. 9A is a schematic of an AND-OR-Inverter (AOI) circuit in a plan view.
Figure 9B:
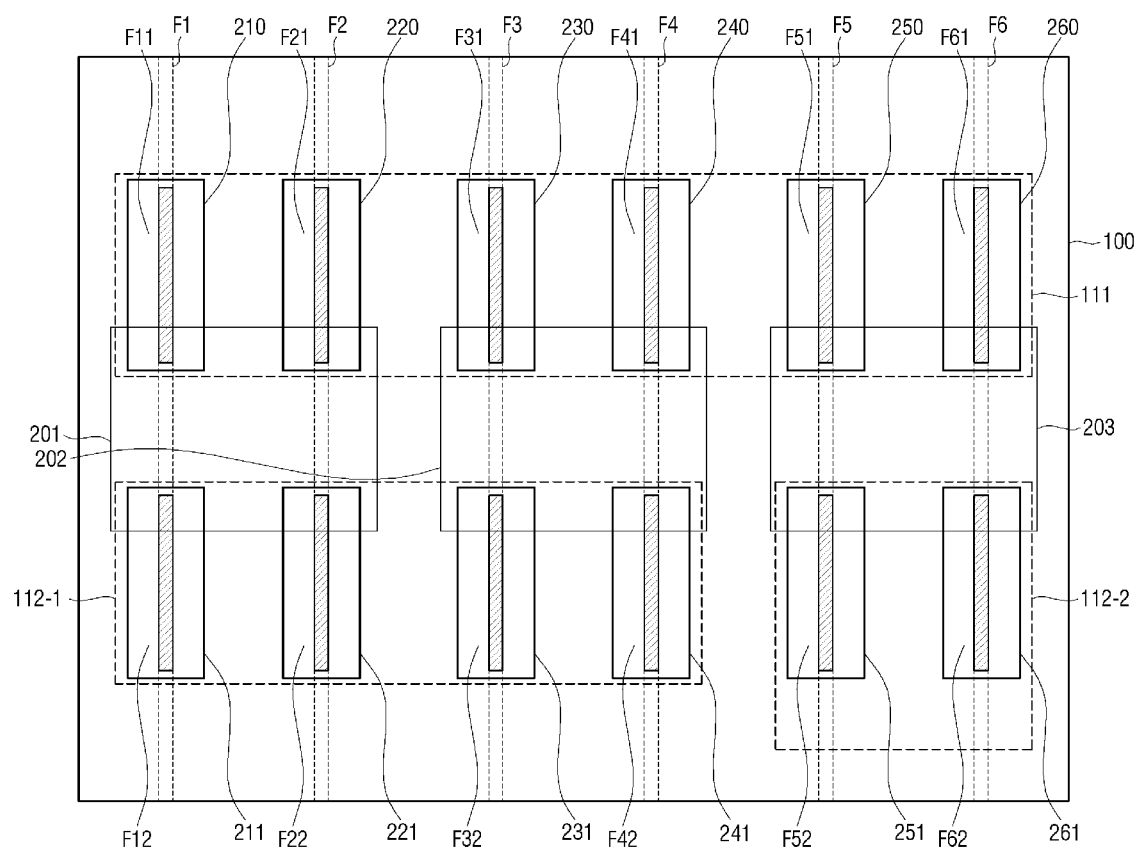
FIGS. 9B to 9D illustrate layouts of a standard cell for the AOI circuit in a plan view, according to embodiments.
Figure 9C:
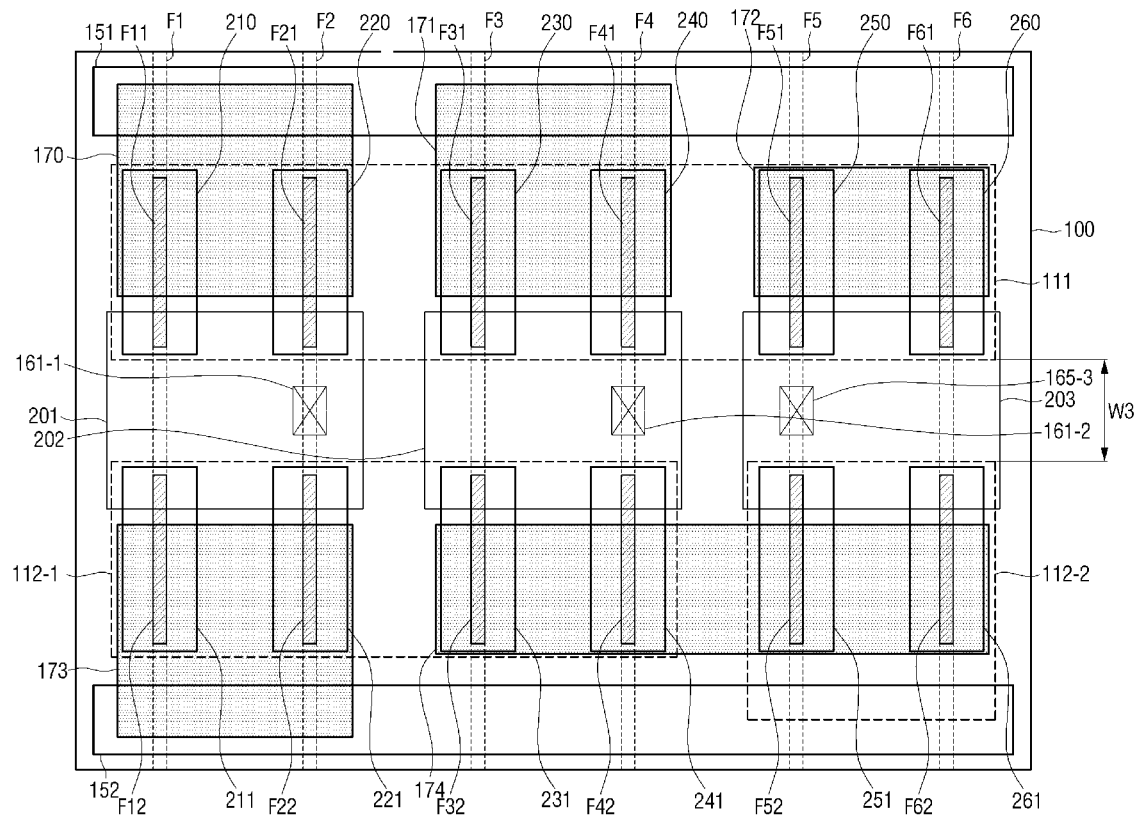
Figure 9D:
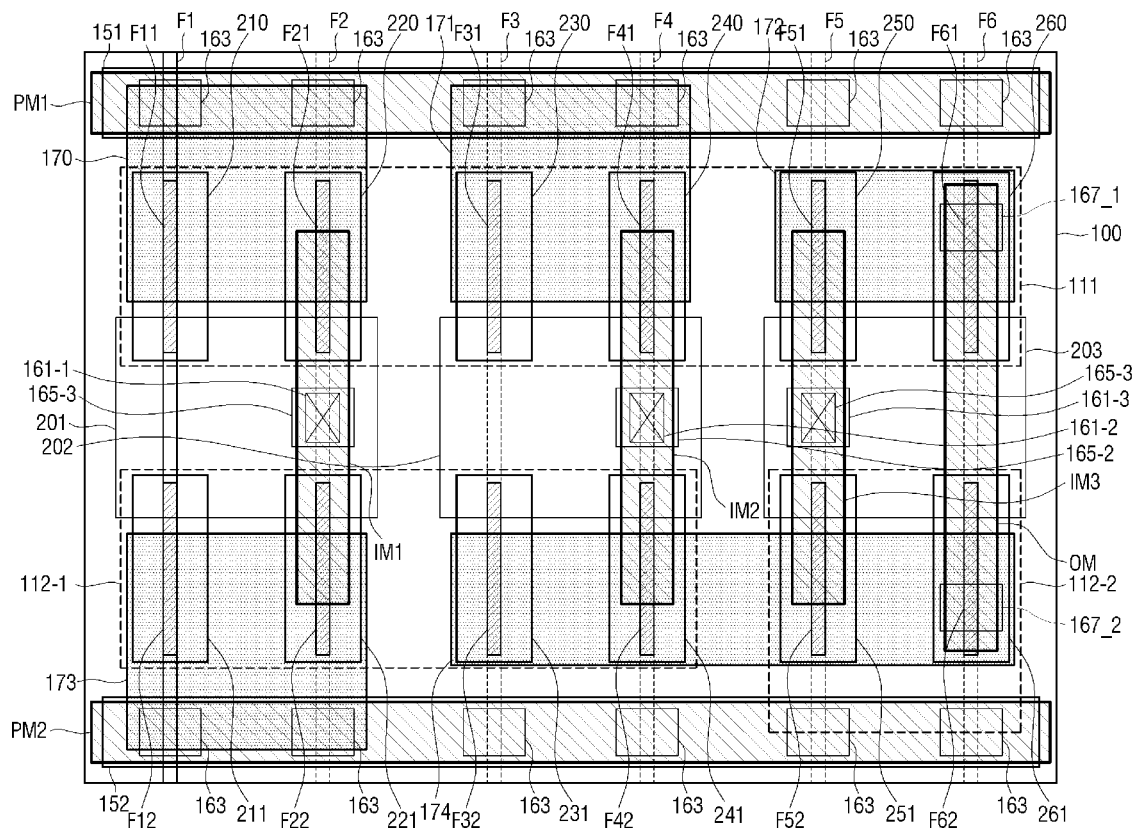

FIG. 9A is a schematic of an AND-OR-Inverter (AOI) circuit in a plan view, and FIGS. 9B to 9D illustrate layouts of a cell for the AOI circuit in a plan view, according to embodiments. Specifically, FIG. 9B is a layout showing up to an FEOL of the cell, FIG. 9C is a layout showing up to an MOL of the cell, and FIG. 9D is a layout showing up to a BEOL of the cell.

In FIG. 9A, the AOI circuit includes an AND circuit, an OR circuit, and an inverter circuit. The AOI circuit includes a PMOS MP1 between a power supply voltage terminal (VDD) and an intermediate node, PMOSs MP2 and MP3 connected in parallel between the intermediate node and an output node, and an NMOS MN3 connected in parallel with two NMOSs MN1 and MN2 connected in series between the output node and a ground voltage terminal (GND). Here, each of the PMOSs and NMOSs is implemented by a VFET. In the AOI circuit, the PMOS MP1 and the NMOS MN3 receive an input signal A at their gates, The PMOS MP2 and the NMOS MN1 receive an input signal B at their gates, the PMOS MP3 and the NMOS MN2 receive an input signal C at their gates, and an output signal D is output through the output node.

In FIG. 9B, the AOI cell may include six fin regions F1 to F6. A distance between the fin regions F1, F2, F3, F4, F5 and F6 may be 1CPP, and a distance between the fin region F1 or F6 and an outermost fin region (not shown) of an adjacent cell may also be 1CPP. The AOI cell may include a pair of vertical channel structures F11 and F12 in the fin region F1, a pair of vertical channel structures F21 and F22 in the fin region F2, a pair of vertical channel structures F31 and F32 in the fin region F3, a pair of vertical channel structures F41 and F42 in the fin region F4, a pair of vertical channel structures F51 and F52 in the fin region F5, and a pair of vertical channel structures F61 and F62 in the fin region F6. As described above, each of the vertical channel structures F11 to F62 forms a vertical channel of a corresponding VFET.

A lower active region 111 may be placed below the vertical channel structures F11, F21, F31, F41, F51 and F61, and doped with P-type impurities according to the present embodiment. A lower active region 112-1 may be formed below the vertical channel structures F12, F22, F32 and F42, and doped with N-type impurities according to the present embodiment. A lower active region 112-2 may be formed below the vertical channel structures F52 and F62, and doped with N-type impurities according to the present embodiment. Thus, the lower active regions 111, 112-1 and 112-2 may function as respective low source/drain regions.

The lower active regions 112-1 and 112-2 may be placed to be spaced apart from each other in the X direction. The lower active region 112-2 may be formed to extend in the Y direction to be longer than the lower active region 112-1.

A spacer layer SL (not shown) may be formed on the lower active regions 111, 112-1 and 112-2 at around the vertical channel structures F11 to F62, respectively. The spacer layer SL may also be formed on sidewalls of upper parts of the lower active regions 111, 112-1, and 112-2. Gate electrodes 210, 211, 220, 221, 230, 231, 240, 241, 250, 251, 260 and 261 may be formed on the spacer layer SL. The gate electrodes 210, 211, 220, 221, 230, 231, 240, 241, 250, 251, 260 and 261 may surround sidewalls of the vertical channel structures F11 to F62, respectively. The gate electrodes 210, 211, 220, 221, 230, 231, 240, 241, 250, 251, 260 and 261 may be spaced apart from the lower active regions 111, 112-1 and 112-2 by the spacer layer SL.

Connection metal layers 201, 202 and 203 may be cut along a metal cutting pattern (not shown) to be spaced apart from one another and from an adjacent connection metal layer of another cell, if any. The connection metal layer 201 may connect the gate electrodes 210, 211, 220 and 221. The connection metal layer 202 may connect the gate electrodes 230, 231, 240 and 241. The connection metal layer 203 may connect the gate electrodes 250, 251, 260 and 261. The connection metal layers 201, 202 and 203 may be spaced apart from one another in the X direction, and receive the input signals A, B and C, respectively, for the AOI circuit of FIG. 9A.

Referring to FIG. 9C, lower source/drain contacts 151 and 152 extending in the X direction may be formed on both ends of the AOI cell in the Y-axis direction and on the lower source/drain region 112-2.

In FIG. 9C, upper source/drain contacts 170, 171 and 172 may be placed to be spaced apart from one another in the X direction, for serial connection between the PMOSs MP1 and MP2/MP3, and parallel connection between the PMOSs MP2 and MP3 shown in FIG. 9A. The upper source/drain contact 170 may be placed on an upper source/drain region (not shown) above the vertical channel structures F11 and F21, the upper source/drain contact 171 may be placed on an upper source/drain region (not shown) above the vertical channel structures F31 and F41, and the upper source/drain contact 172 may be placed on an upper source/drain region (not shown) on the vertical channel structures F51 and F61.

The upper source/drain contacts 170 and 171 may be placed to extend in the Y direction up to an upper surface of the lower source/drain contact 151. That is, the upper source/drain contacts 170 and 171 may be placed to overlap portions of the lower source/drain contact 151, respectively, in the Z direction. The upper source/drain contact 172 may be placed so as not to overlap the lower source/drain contact 151 in the Z direction. That is, a length of the upper source/drain contacts 170 and 171 is greater than a length of the upper source/drain contact 172 in the Y direction.

The upper source/drain contacts 173 and 174 may be placed to be spaced apart from each other in the X direction for parallel connection of the NMOSs MN1/MN2 and MN3 and serial connection of MN1 and MN2 shown in FIG. 9A. The upper source/drain contact 173 may be placed to extend in the X direction and disposed on an upper source/drain region above the vertical channel structures F12 and F22. The upper source/drain contact 174 may be placed to extend in the X direction and disposed on an upper source/drain region above the vertical channel structures F32, F42, F52 and F62.

The upper source/drain contact 173 may be placed to extend in the Y direction up to an upper surface of the lower source/drain contact 152. That is, the upper source/drain contact 173 may be placed to overlap a portion of the lower source/drain contact 152 in the Z direction. The upper source/drain contact 174 may be placed so as not to overlap the lower source/drain contact 152 in the Z direction. That is, a length of the upper source/drain contact 173 in the Y direction is greater than a length of the upper source/drain contact 174 in the Y direction.

Referring to FIGS. 9A and 9C, the upper source/drain contact 170 may correspond to a source terminal of the PMOS MP1, the upper source/drain contact 171 may correspond to a source terminal of the PMOS MP2, and the upper source/drain contact 172 may correspond to a source terminal of the PMOS MP3. The upper source/drain contact 173 may correspond to a drain terminal of the NMOS MN3, and the upper source/drain contact 174 may correspond to source and drain terminals of the NMOSs MN1 and MN2.

The lower active regions 111 and 112-1 may be placed to be spaced apart from each other by a distance $W_3$ in the Y direction, and the lower active regions 111 and 112-2 may also be placed to be spaced apart from each other by the distance $W_3$ in the Y direction. The connection metal layers 201, 202 and 203 may be placed between the lower active regions 111, 112-1 and 112-2.

The connection metal layer 201 may also be placed between the vertical channel structures F11, F21, F12 and F22. That is, the connection metal layer 201 may extend in the X direction to be placed over the fin regions F1 and F2. The connection metal layer 202 may be placed between the vertical channel structures F31, F41, F32 and F42. That is, the connection metal layer 202 may extend in the X direction to be placed over the fin regions F3 and F4. The connection metal layer 203 may be placed between the vertical channel structures F51, F61, F52 and F62. That is, the connection metal layer 203 may extend in the X direction to be placed over the fin regions F5 and F6.

A gate via 161-1 may be placed on an upper surface of the connection metal layer 201 corresponding to the fin region F2. A gate via 161-2 may be placed on an upper surface of the connection metal layer 202 corresponding to the fin region F4. The gate via 161-3 may be placed on an upper surface of the connection metal layer 203 corresponding to the fin region F5.

In FIG. 9D, power wirings PM1 and PM2 may be extended in the X direction and connected to the lower source/drain contacts 151 and 152, respectively, through lower source/drain vias 163. The power wirings PM1 and PM2 may be placed on a level in the Z direction which is the same as or different from a level of input wiring IM1 and IM2 and an output wiring OM, according to some embodiments. If the lower active region 111 is P-type doped, a power supply voltage VDD may be applied to the power wiring PM1, and if the lower active regions 112-1 and 112-2 are N-type doped, a ground voltage GND may be applied to the power wiring PM2.

The input wiring IM1 may be extended in the Y direction and connected to the connection metal layer 201 through the gate via 161-1. The input wiring IM1 may be placed to be parallel with the fin region F2 in the Y direction and overlap a portion of the fin region F1 in the Z direction. The input signal A of the AOI circuit of FIG. 9A may be input to the input wiring IM1. The input wiring IM2 may be extended in the Y direction and connected to the connection metal layer 202 through a gate via 161-2. The input wiring IM2 may be placed to be parallel with the fin region F4 in the Y direction and overlap a portion of the fin region F4 in the Z direction. The input signal B of the AOI circuit of FIG. 9A may be input to the second input wiring IM2. An input wiring IM3 may extend in the Y direction, and be connected to the connection metal layer 203 through a gate via 161-3. The input wiring IM3 may be placed to be parallel with the fin region F5 in the Y direction and overlap a portion of the fin region F5 in the Z direction. The input signal C of the AOI circuit of FIG. 9A may be input to the input wiring IM3.

The output wiring OM may be placed to be parallel with the fin region F6 in the Y direction and overlap a portion of the fin region F6 in the Z direction. The output wiring OM may be connected to the upper source/drain contacts 171 and 172 through upper source/drain vias 167-1 and 167-2, respectively. The output signal D may be output to an upper wiring (not shown) through an output via (not shown) placed on the output wiring OM.

Figure 10A:
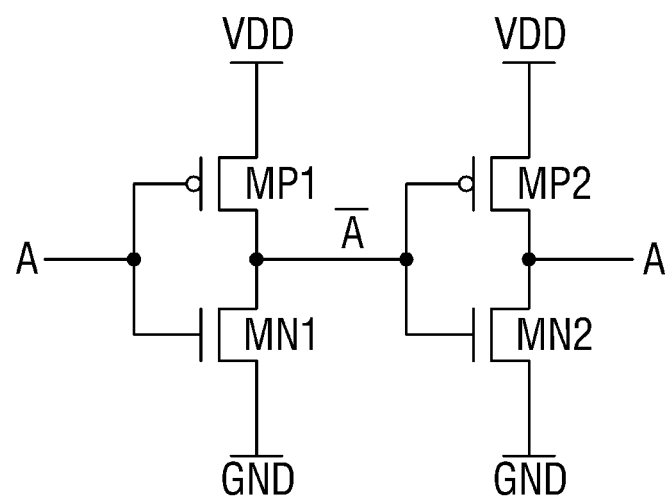
FIG. 10A is a schematic of a buffer circuit.
Figure 10B:
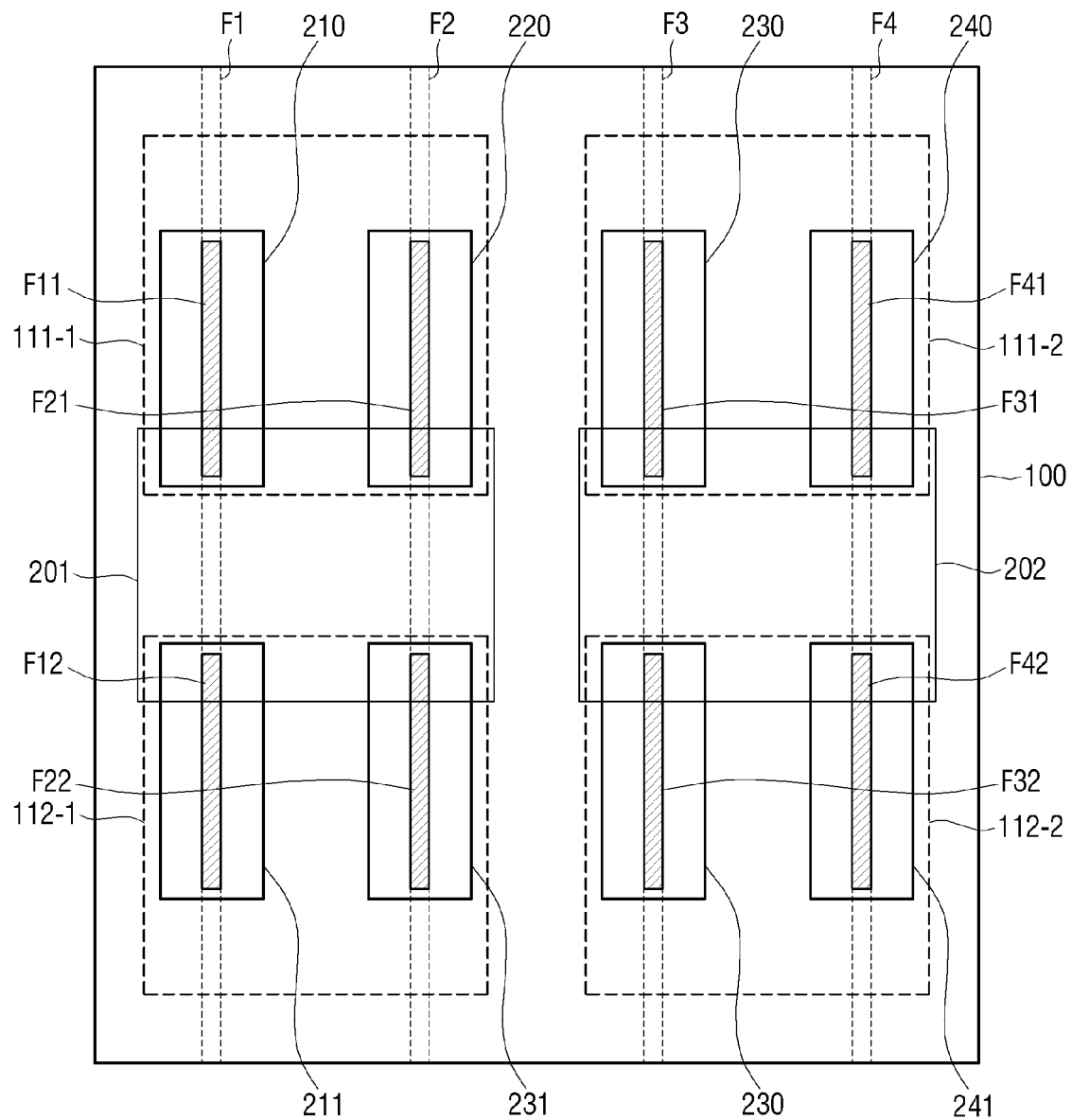
FIGS. 10B to 10D illustrate layouts of a standard cell for the buffer circuit in a plan view, according to embodiments.
Figure 10C:
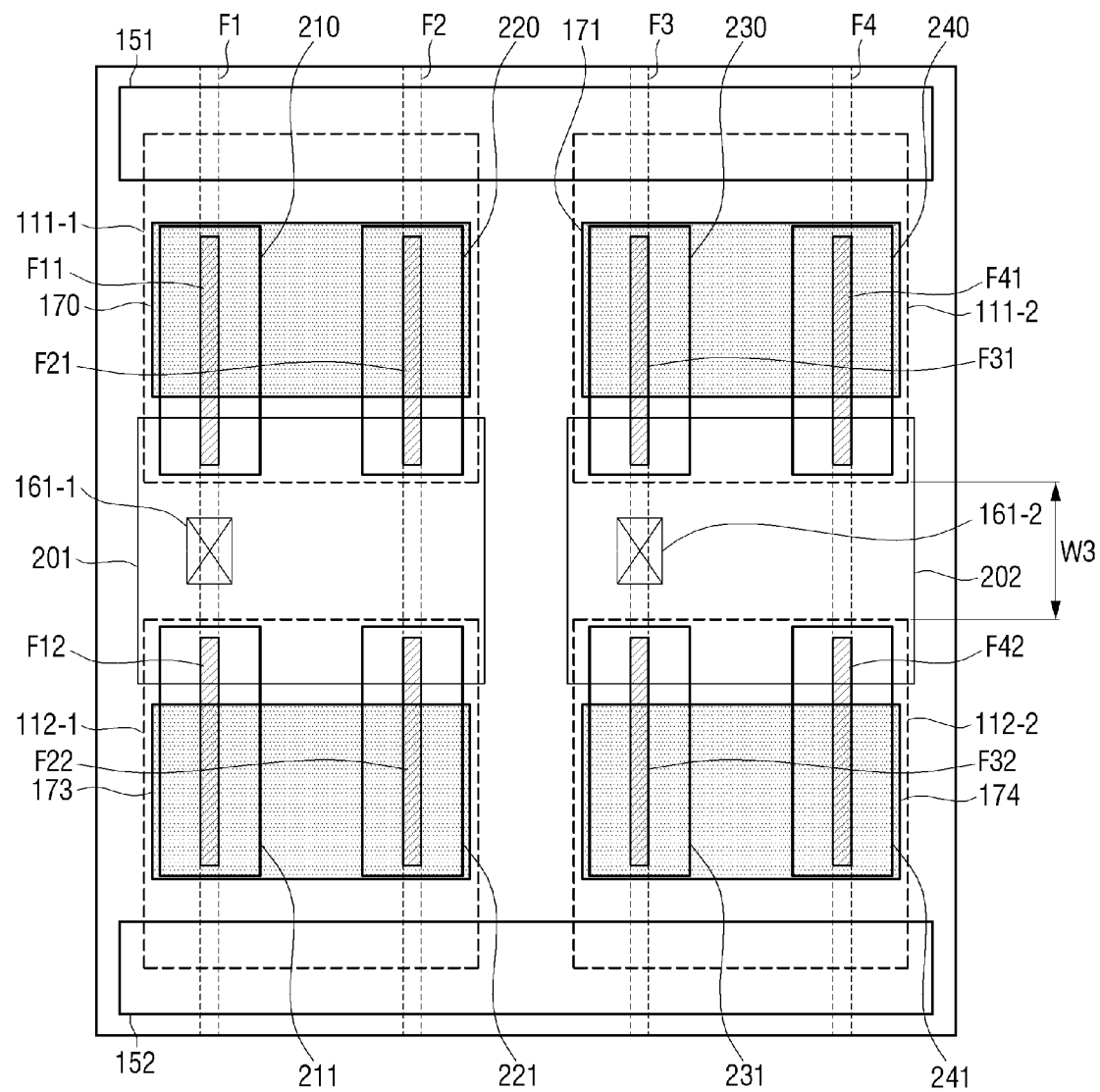
Figure 10D:
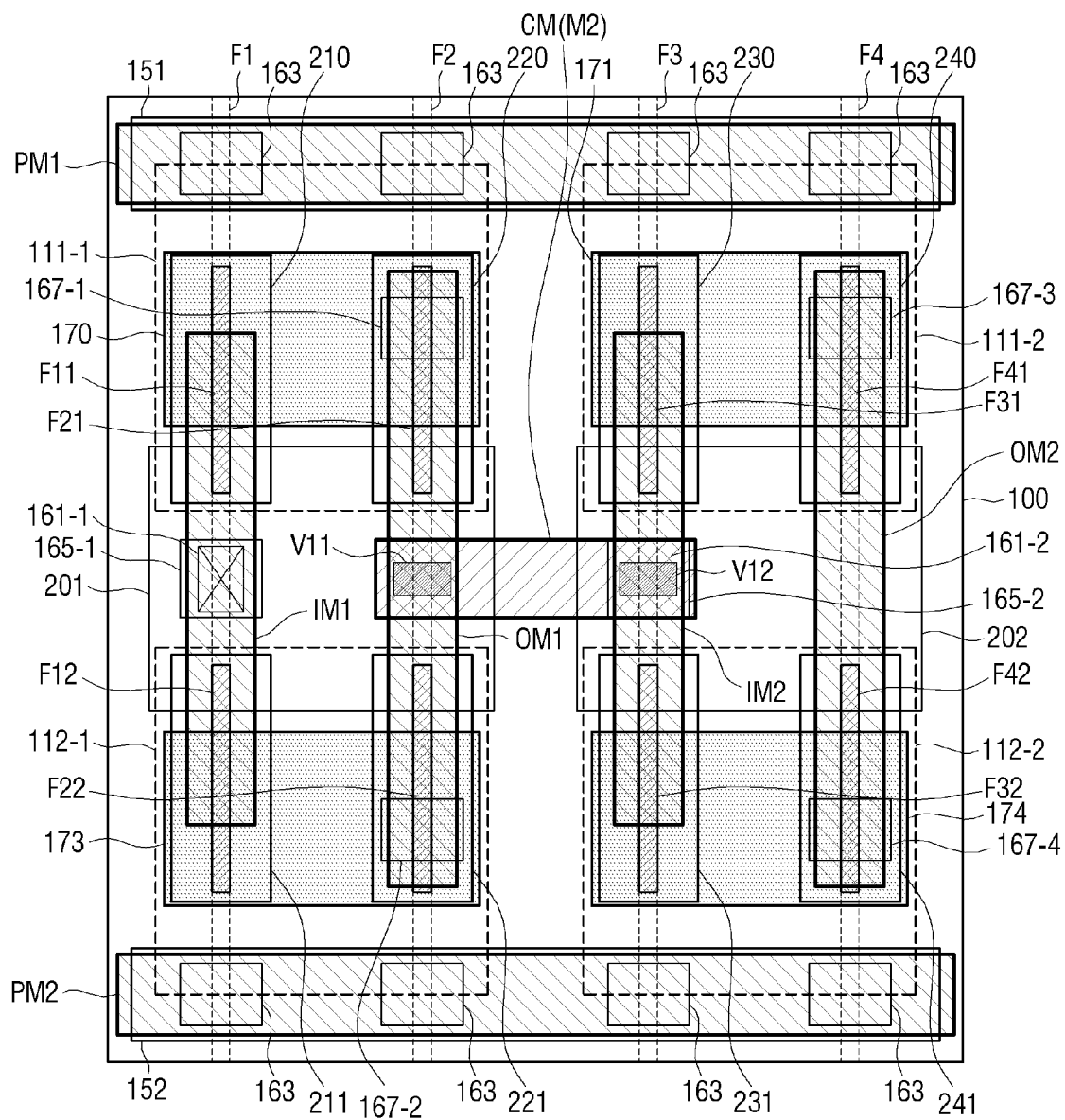

FIG. 10A is a schematic of a buffer circuit, and FIGS. 10B to 10D illustrate layouts of a cell for the buffer circuit in a plan view, according to embodiments. Specifically, FIG. 10B is a layout showing up to an FEOL of the cell, FIG. 10C is a layout showing up to an MOL of the cell, and FIG. 10D is a layout showing up to a BEOL of the cell.

In FIG. 10A, the buffer circuit includes a plurality of inverter circuits. For convenience of description, descriptions will be made on the premise that a buffer circuit including two inverter circuits. The first inverter circuit may include a PMOS MP1 connected between a power supply voltage terminal (VDD) and a first output node, and an NMOS MN1 connected between the first output node and a ground voltage terminal (GND). The second inverter circuit may include a PMOS MP2 connected between the power supply voltage terminal (VDD) and a second output node, and an NMOS MN2 connected between the second output node and the ground voltage terminal (GND). Here, each of the PMOSs and NMOSs is implemented by a VFET. The first output node of the first inverter circuit functions as an input node of the second inverter circuit. When an input signal A of the buffer circuit is input to gates of the PMOS MP1 and the NMOS MN1 at an input node of the first inverter, an inverted signal $\overline{A}$ is output from the first output node of the first inverter, and the second inverter receives the inverted signal $\overline{A}$ at gates of the PMOS MP2 and the NMOS MN2 and outputs an output signal A through the second output node.

In FIG. 10B, the buffer cell may include four fin regions F1 to F4. A distance between the fin regions F1, F2, F3 and F4 may be 1CPP, and a distance between the fin region F1 or F4 and an outermost fin region (not shown) of an adjacent cell may also be 1CPP. The buffer cell includes a pair of vertical channel structures F11 and F12 in the fin region F1, a pair of vertical channel structures F21 and F22 in the fin region F2, a pair of vertical channel structures F31 and F32 in the fin region F3, and a pair of vertical channel structures F41 and F42 in the fin region F4. As described above, each of the vertical channel structures F11 to F42 forms a vertical channel of a corresponding VFET.

A lower active region 111-1 may be placed below the vertical channel structures F11 and F21, and a lower active region 111-2 may be placed below the vertical channel structures F31 and F41. The lower active regions 111-1 and 111-2 may be doped with P-type impurities according to the present embodiment. A lower active region 112-1 may be placed below the vertical channel structures F12 and F22, and a lower active region 112-2 may be placed below the vertical channel structures F32 and F42. The lower active regions 112-1 and 112-2 may be doped with N-type impurities according to the present embodiment. Thus, the lower active regions 111-1, 111-2, 112-1 and 112-2 may function as respective lower source/drain regions.

The lower active regions 111-1 and 111-2 may be placed to be spaced apart from each other in the X direction, and the lower active regions 112-1 and 112-2 may also be placed to be spaced apart from each other in the X direction. The lower active regions 111-1 and 111-2 may be formed to have the same length in the Y direction. The lower active regions 112-1 and 112-2 may also be formed to have the same length in the Y direction.

A spacer layer SL (not shown) may be formed on the lower active regions 111-1, 111-2, 112-1 and 112-2 at around the vertical channel structures F11 to F42, respectively. The spacer layer SL may also be formed on sidewalls of upper parts of the lower active regions 111-1, 111-2, 112-1 and 112-2. Gate electrodes 210, 211, 220, 221, 230, 231, 240 and 241 may be formed on the spacer layer SL. The gate electrodes 210, 211, 220, 221, 230, 231, 240 and 241 may surround sidewalls of the vertical channel structures F11 to F42, respectively. The gate electrodes 210, 211, 220, 221, 230, 231, 240 and 241 may be spaced apart from the lower active regions 111-1, 111-2, 112-1 and 112-2 by the spacer layer SL.

Connection metal layers 201 and 202 may be cut along a metal cutting pattern (not shown) to be spaced apart from each other and from an adjacent connection metal layer of another cell, if any. The connection metal layer 201 may connect the gate electrodes 210, 211, 220 and 221. The connection metal layer 202 may connect the gate electrodes 230, 231, 240 and 241. The connection metal layers 201 and 202 may be spaced apart from each other in the X direction, and receive the input signal A and the inverted signal $\overline{A}$ of the buffer circuit of FIG. 10A.

Referring to FIG. 10C, lower source/drain contacts 151 and 152 extending in the X direction may be formed on both ends of the buffer cell in the Y-axis direction and on the lower active regions 111-1, 111-2, 112-1 and 112-2 which are respective lower source/drain regions.

In FIG. 10C, upper source/drain contacts 170 and 171 may be placed to be spaced from each other in the X direction, and upper source/drain contacts 173 and 174 may be placed to be spaced from each other in the X direction. The upper source/drain contact 170 may be placed on an upper source/drain region (not shown) above the vertical channel structures F11 and F21, and the upper source/drain contact 171 may be placed on an upper source/drain region (not shown) above the vertical channel structures F31 and F41.

The upper source/drain contacts 170, 171, 173 and 174 may be placed so as not to overlap the lower source/drain contacts 151 and 152 in the Z direction. The upper source/drain contacts 170, 171, 173 and 174 may have a same length in the Y direction and a same length in the X direction.

Referring to FIGS. 10A and 10C, the upper source/drain contact 170 may correspond to a drain terminal of the PMOS MP1, and the upper source/drain contact 171 may correspond to a drain terminal of the PMOS MP2. The upper source/drain contact 173 may correspond to a drain terminal of the NMOS MN1, and the upper source/drain contact 174 may correspond to a drain terminal of the NMOS MN2.

The lower active regions 111-1 and 111-2 and the lower active regions 112-1 and 112-2 may be placed to be spaced apart from each other in the Y direction by a distance $W_3$. The connection metal layers 201 may be placed between the lower active regions 111-1 and 111-2, and the connection metal layers 202 may be placed between the lower active regions 112-1 and 112-2.

The connection metal layer 201 may also be placed between the vertical channel structures F11, F21, F12 and F22. That is, the connection metal layer 201 may extend in the X direction to be placed over the fin regions F1 and F2. The connection metal layer 202 may be placed between the vertical channel structures F31, F41, F32 and F42. That is, the connection metal layer 202 may extend in the X direction to be placed over the fin regions F3 and F4.

A gate via 161-1 may be placed on an upper surface of the connection metal layer 201 corresponding to the fin region F1. A gate via 161-2 may be placed on an upper surface of the connection metal layer 202 corresponding to the fin region F3.

In FIG. 10D, power wirings PM1 and PM2 may be extended in the X direction and connected to the lower source/drain contacts 151 and 152, respectively, through lower source/drain vias 163. The power wirings PM1 and PM2 may be placed on a level in the Z direction which is the same as of different from a level of input wirings IM1 and IM2 and output wirings OM1 and OM2, according to embodiments. If the lower active regions 111-1 and 11-2 are P-type doped, a power supply voltage VDD may be applied to the power wiring PM1, and if the lower active regions 112-1 and 112-2 are N-type doped, a ground voltage GND may be applied to the power wiring PM2.

The input wiring IM1 may be extended in the Y direction and connected to the connection metal layer 201 through the gate via 161-1. The input wiring IM1 may be placed to be parallel with the fin region F1 in the Y direction and overlap a portion of the fin region F1 in the Z direction. The input signal A of the buffer circuit of FIG. 10A may be input to the input wiring IM1.

The output wiring OM1 may output the inverted signal $\overline{A}$. The output wiring OM1 may be placed to be parallel with the fin region F2 in the Y direction and overlap a portion of the fin region F2 in the Z direction. The output wiring OM1 may be connected to the upper source/drain contacts 170 and 173 through upper source/drain vias 167-1 and 167-2, respectively. The inverted signal $\overline{A}$ may be output to an intermediate connection wiring CM through a connection via V11 placed on the output wiring OM1.

The input wiring IM2 may be extended in the Y direction and connected to the connection metal layer 202 through the gate via 161-2. The input wiring IM2 may be placed to be parallel with the fin region F3 in the Y direction and overlap a portion of the fin region F3 in the Z direction.

While the connection via V11 is placed on the output wiring OM1, a connection via V12 is placed on the input wiring IM2 and is connected to the intermediate connection wiring CM. The intermediate connection wiring CM is placed on an upper metal wiring (not shown) of the input wirings IM1 and IM2 and the output wirings OM1 and OM2. The intermediate connection wiring CM is extended in the X direction and connected to the connection vias V11 and V12. The intermediate connection wiring CM is placed to intersect the output wiring OM1 and the input wiring IM2, which are extended in the Y direction, in the X direction. The input wiring IM2 may receive the inverted signal $\overline{A}$ of the buffer circuit of FIG. 10A through the intermediate connection wiring CM.

The output wiring OM2 may output the output signal A. The output wiring OM2 may be placed to be parallel with the fin region F4 in the Y direction and overlap a portion of the fin region F4 in the Z direction. The output wiring OM2 may be connected to the upper source/drain contacts 171 and 174 through upper source/drain vias 167-3 and 167-4. The output signal A may be output to an upper wiring (not shown) through a connection via (not shown) placed on the output wiring OM2.

In FIGS. 10A-10D, the buffer circuit is implemented in a single cell according to the present embodiment. However, the buffer circuit may be implemented by combining and modifying two inverter cells such as the cell shown in FIG. 1 according to an embodiment.

In concluding the detailed description, those skilled in the art will appreciate that many variations and modifications may be made to the above embodiments without substantially departing from the principles of the inventive concept. Therefore, the above embodiments are used in a generic and descriptive sense only and not for purposes of limitation.

What is claimed is:

1. An integrated circuit comprising first and second cells adjacent to each other in a first direction, wherein the first cell comprises:
    first and second lower source/drain regions extending on a substrate in the first direction, and arranged to be spaced apart from each other in a second direction;
    a pair of first vertical channel structures placed to intersect the first and second lower source/drain regions in the second direction;
    a pair of second vertical channel structures placed to intersect the first and second lower source/drain regions in the second direction, and arranged to be spaced apart from the pair of the first vertical channel structures in the second direction;
    a pair of first upper source/drain regions and a pair of second upper source/drain regions placed on the pair of first vertical channel structures and the pair of second vertical channel structures, respectively;
    first and second gate electrodes surrounding side surfaces of the pair of the first vertical channel structures, respectively, and third and fourth gate electrodes surrounding side surfaces of the pair of the second vertical channel structures, respectively;
    a connection metal layer connected to the first, second, third and fourth gate electrodes;
    an input wiring connected to at least one of the first, second, third and fourth gate electrodes through a gate via to receive an input signal; and
    an output wiring connected to the pair of the second upper source/drain regions through an upper source/drain via, wherein a distance between the pair of the second vertical channel structures of the first cell and an adjacent pair of first vertical channel structures in the second cell, which face a cell boundary between the first and second cells, is the same as a distance between the pair of the first vertical channel structures and the pair of the second vertical channel structures, in the first direction.

2. The integrated circuit of claim 1, wherein the second cell also comprises the first and second lower source/drain regions, the pair of the first vertical channel structures, the pair of the second vertical channel structures, the pair of the first upper source/drain regions, the pair of the second upper source/drain regions, the first, second, third and fourth gate electrodes, the connection metal layer, the input wiring, and the output wiring.

3. The integrated circuit of claim 1, wherein the connection metal layer in the first cell and an adjacent connection metal layer in the second cell, which face the cell boundary, are spaced apart from the cell boundary by a same distance, in the first direction.

4. The integrated circuit of claim 1, wherein the first cell further comprises:
    first and second lower source/drain contacts extending in the first direction and connected to the first and second lower source/drain regions, respectively; and first and second upper source/drain contacts placed on the pair of the first upper source/drain regions and the pair of the second upper source/drain regions to be connected thereto.

5. The integrated circuit of claim 1, wherein the first lower source/drain region in the first cell and an adjacent first lower source/drain region in the second cell, which face the cell boundary, are spaced apart from the cell boundary by a same distance, in the first direction.

6. The integrated circuit of claim 5, wherein a distance between the connection metal layer in the first cell and an adjacent connection metal layer in the second cell, which face the cell boundary, is the same or greater than a distance between the first lower source/drain region in the first cell and the adjacent first lower source/drain region in the second cell, which face the cell boundary, in the first direction.

7. The integrated circuit of claim 1, wherein the first and second cells do not comprise a diffusion break region or a dummy fin region therebetween.

8. An integrated circuit comprising first and second cells adjacent to each other in a first direction, wherein each of the first and second cells comprises:
   first and second fin regions placed to be spaced apart from each other in a first direction and extending in a second direction;
   first and second vertical channel structures arranged to be spaced apart from each other in the second direction on the first fin region;
   third and fourth vertical channel structures arranged to be spaced apart from each other in the second direction on the second fin region;
   first, second, third and fourth upper source/drain regions placed on the first, second, third and fourth vertical channel structures, respectively;
   a first lower source/drain region extending in the first direction and placed below the first and third vertical channel structures;
   a second lower source/drain region extending in the first direction and placed below the second and fourth vertical channel structures;
   first, second, third and fourth gate electrodes surrounding side surfaces of the first, second, third and fourth vertical channel structures between the first, second, third and fourth upper source/drain regions and the first and second lower source/drain regions;
   a spacer layer formed between the first, second, third and fourth vertical channel structures and the first and second lower source/drain regions; and
   a connection metal layer placed between the first, second, third and fourth vertical channel structures and connected to at least one of the first, second, third and fourth gate electrodes,
   wherein a distance by which the connection metal layer and the first and second lower source/drain regions in the first cell are spaced apart from a cell boundary between the first and second cells is equal to a distance by which the connection metal layer and the first and second lower source/drain regions in the second cell are spaced apart from the cell boundary, and
   wherein a distance between the second fin region in the first cell and the first fin region in the second cell, which face the cell boundary, is equal to a distance between the first and second fin regions in the first or second cell, in the first direction.

9. The integrated circuit of claim 8, wherein a distance between the connection metal layer in the first cell and the connection metal layer in the second cell facing the cell boundary, which the cell boundary, is the same as or greater than a distance between the first lower source/drain region in the first cell and the first lower source/drain region in the second cell, which face the cell boundary, in the first direction.

10. The integrated circuit of claim 8, wherein each of the first and second cells further comprises:
    a gate contact placed on the connection metal layer and connected to the first, second, third and fourth gate electrodes;
    an input wiring placed on the gate contact to be connected thereto through a gate via, and extending in the second direction;
    at least two upper source/drain contacts placed on the first, second, third and fourth upper source/drain regions to overlap at least two of the first to fourth upper source/drain regions; and
    an output wiring placed on the at least two upper source/drain contacts to be connected thereto through at least two upper source/drain vias.

11. The integrated circuit of claim 10, further comprising:
    a first connection via placed on the output wiring in the first cell;
    a second connection via placed on the input wiring in the second cell; and
    an intermediate connection wiring placed on the first and second connection vias to be connected thereto, and extending in the first direction.

12. The integrated circuit of claim 8, wherein each of the first and second cells further comprises:
    first and second lower source/drain contacts extending in the first direction, and connected to extended portions of the first and second lower source/drain regions;
    a first power wiring extending in the first direction and connected to the first lower source/drain contact through a first lower source/drain via; and
    a second power wiring extending in the first direction and connected to the second lower source/drain contact through a second lower source/drain via,
    wherein the first and second power wirings provide different polarity power voltages.

13. The integrated circuit of claim 8, wherein a distance between the second fin region in the first cell and the first fin region in the second cell, which face the cell boundary, is 1 critical poly pitch (1CPP).

14. A layout method of an integrated circuit in a first cell adjacent to a second cell in a first direction, the method comprising:
    forming first and second lower source/drain regions extending in a first direction and spaced apart from each other in a second direction, on a substrate;
    patterning first and second fin regions extending in the second direction and intersecting the first and second lower source/drain regions;
    forming first and second vertical channel structures on the first fin regions to correspond to the first and second lower source/drain regions, and forming third and fourth vertical channel structures on the second fin region to correspond to the first and second lower source/drain regions;
    forming first to fourth gate electrodes surrounding side surfaces of the first to fourth vertical channel structures, respectively;
    forming a connection metal layer connecting the first, second, third and fourth gate electrodes;

forming first, second, third and fourth upper source/drain regions on the first, second, third and fourth vertical channel structures, respectively;

forming at least one first upper source/drain contact and at least one second upper source/drain contact on at least two of the first, second, third and fourth upper source/drain regions;

forming at least one gate contact on the connection metal layer;

forming first and second source/drain vias on the first and second upper source/drain contacts, respectively, and forming a gate via on the gate contact;

forming an input wiring extending in the second direction and connected to the gate via; and forming an output wiring extending in the second direction and connected to at least one of the first and second source/drain vias, wherein a distance between the second fin region in the first cell and an adjacent fin region in the second cell, which face a cell boundary between the first and second cells, is the same as a distance between the first and second fin regions, in the first direction.

15. The layout method of an integrated circuit of claim 14, wherein the connection metal layer is formed such that the connection metal layer in the first cell and an adjacent connection metal layer in the second cell, which face the cell boundary, are spaced apart from the cell boundary by a same distance, in the first direction.

16. The layout method of an integrated circuit of claim 14, wherein the first and second lower source/drain regions are formed such that the first and second lower source/drain regions in the first cell and adjacent first and second lower source/drain regions in the second cell, which face the cell boundary, are spaced apart from the cell boundary by a same distance, in the first direction.

17. The layout method of an integrated circuit of claim 16, further comprising forming a boundary separation film extending in the second direction between the first and second lower source/drain regions in the first cell and the adjacent first and second active regions in the second cell.

18. The layout method of an integrated circuit of claim 14, further comprising an active region separation film between the first and second source/drain regions.

19. The layout method of an integrated circuit of claim 14, wherein a distance between the second fin region in the first cell and an adjacent fin region in the second cell, which face the cell boundary, is 1 critical poly pitch (1CPP).

20. The layout method of an integrated circuit of claim 14, further comprising:

forming first and second lower source/drain contacts extending in the first direction and connected to extended portions of the first and second lower source/drain regions;

forming a first power wiring extending in the first direction; and forming a second power wiring extending in the first direction, wherein the first power wiring is connected to the first upper source/drain contact or the first lower source/drain contact, and the second power wiring is connected to the second upper source/drain contact or the second lower source/drain contact.

21. The layout method of an integrated circuit of claim 20, wherein the first or second lower source/drain contact extends in the first direction to overlap at least three or more fin regions including the first and second fin regions.

22. The layout method of an integrated circuit of claim 14, wherein the first or second upper source/drain contact is formed to extend in the first direction to overlap at least three or more fin regions including the first and second fin regions.

* * * * *